United States Patent
Kamura et al.

(10) Patent No.: US 10,018,912 B2
(45) Date of Patent: Jul. 10, 2018

(54) PHOTOSENSITIVE RESIN COMPOSITION, WAVELENGTH CONVERSION SUBSTRATE AND LIGHT EMITTING DEVICE

(71) Applicant: Sharp Kabushiki Kaisha, Sakai, Osaka (JP)

(72) Inventors: Masakazu Kamura, Sakai (JP); Akiko Iwata, Sakai (JP); Hiroshi Nakano, Sakai (JP); Bai Zhang, Sakai (JP); Hidetsugu Matsukiyo, Sakai (JP); Shigeru Aomori, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/318,034

(22) PCT Filed: Jun. 12, 2015

(86) PCT No.: PCT/JP2015/067002
§ 371 (c)(1),
(2) Date: Dec. 12, 2016

(87) PCT Pub. No.: WO2015/190594
PCT Pub. Date: Dec. 17, 2015

(65) Prior Publication Data
US 2017/0123317 A1   May 4, 2017

(30) Foreign Application Priority Data

Jun. 13, 2014 (JP) .................................. 2014-122195
Jun. 10, 2015 (JP) .................................. 2015-117689

(51) Int. Cl.
G03F 7/039 (2006.01)
F21V 9/16 (2006.01)
(Continued)

(52) U.S. Cl.
CPC ................ *G03F 7/039* (2013.01); *F21V 9/16* (2013.01); *F21V 9/30* (2018.02); *G02B 5/201* (2013.01);
(Continued)

(58) Field of Classification Search
CPC ... G03F 7/039; F21V 9/16; F21V 9/30; F21V 9/32; F21V 13/14; G02B 5/201;
(Continued)

(56) References Cited

U.S. PATENT DOCUMENTS 4,649,100 A   3/1987 Leyrer et al.
4,736,055 A   4/1988 Dietliker et al.
(Continued)

FOREIGN PATENT DOCUMENTS

EP   0 725 315 A2   8/1996
JP   60-150048 A    8/1985
(Continued)

OTHER PUBLICATIONS

Official Communication issued in International Patent Application No. PCT/JP2015/067002, dated Jul. 7, 2015.

*Primary Examiner* — Bao Q Truong
(74) *Attorney, Agent, or Firm* — Keating & Bennett, LLP

(57) ABSTRACT

A photosensitive resin composition includes a positive photosensitive resin having a photosensitive moiety that cleaves upon exposure to light, and a wavelength conversion material dispersed in the photosensitive resin. The photosensitive resin and the wavelength conversion material meet (i) to (iv):
(i) The photosensitive moiety and the cleavage product of the photosensitive resin do not neutralize the wavelength conversion material;
(ii) The photosensitive moiety and the cleavage product do not induce hydrolysis of the wavelength conversion material;

(Continued)

(iii) The HOMOs of the photosensitive moiety and the cleavage product are lower than the LUMO of the wavelength conversion material; and (iv) The LUMOs of the photosensitive moiety and the cleavage product are higher than the HOMO of the wavelength conversion material.

(Any combination of a chemically amplified photosensitive resin with an acidic photosensitive moiety or cleavage product and an acidic wavelength conversion material is excluded.)

14 Claims, 10 Drawing Sheets

(51) Int. Cl.
*G02B 5/20* (2006.01)
*F21V 9/30* (2018.01)
*F21Y 115/20* (2016.01)
*F21Y 115/10* (2016.01)
*H01L 27/32* (2006.01)
*H01L 31/055* (2014.01)

(52) U.S. Cl.
CPC ........ *F21Y 2115/10* (2016.08); *F21Y 2115/20* (2016.08); *H01L 27/322* (2013.01); *H01L 27/3244* (2013.01); *H01L 31/055* (2013.01); *H01L 2227/323* (2013.01)

(58) Field of Classification Search
CPC ............. F21Y 2115/20; F21Y 2115/10; H01L 27/322; H01L 27/3244; H01L 31/055; H01L 2227/323
See application file for complete search history.

(56) References Cited

U.S. PATENT DOCUMENTS

| | | | |
|---|---|---|---|
| 4,835,086 A | 5/1989 | Jain | |
| 6,537,719 B1 | 3/2003 | Takahashi | |
| 2013/0306952 A1* | 11/2013 | Yamae | H01L 51/5212 257/40 |
| 2014/0009905 A1* | 1/2014 | Kobayashi | H01L 27/322 362/84 |
| 2014/0312339 A1* | 10/2014 | Fujita | H01L 27/322 257/40 |
| 2015/0042933 A1* | 2/2015 | Ueki | G02B 5/0242 349/108 |

FOREIGN PATENT DOCUMENTS

| | | |
|---|---|---|
| JP | 61-251652 A | 11/1986 |
| JP | 02-004260 A | 1/1990 |
| JP | 05-232703 A | 9/1993 |
| JP | 08-262728 A | 10/1996 |
| JP | 09-208704 A | 8/1997 |
| JP | 2000-003047 A | 1/2000 |
| WO | 00/48044 A1 | 8/2000 |
| WO | 2005/116770 A1 | 12/2005 |

* cited by examiner

PHOTOSENSITIVE RESIN COMPOSITION, WAVELENGTH CONVERSION SUBSTRATE AND LIGHT EMITTING DEVICE

TECHNICAL FIELD

An aspect of the present invention relates to a photosensitive resin composition, a wavelength conversion substrate, and a light emitting device.

This application claims priority based on Japanese Patent Application No. 2014-122195, filed on Jun. 13, 2014, and Japanese Patent Application No. 2015-117689, filed on Jun. 10, 2015. The contents of these applications are incorporated herein.

BACKGROUND ART

Light emitting layers containing phosphor materials (phosphor layers) have been widely used in various kinds of equipment. For example, substrates having a phosphor layer, or phosphor substrates, are an important component of organic EL, liquid-crystal, and other displays and light fixtures.

Such a phosphor layer can be formed through, for example, the formation of a resin layer by applying a photosensitive resin composition in which a phosphor material has been dissolved or dispersed to a substrate and subsequent patterning of the resin layer into a desired shape (e.g., see PTL 1 to 4).

CITATION LIST

Patent Literature

PTL 1: Japanese Unexamined Patent Application Publication No. 2000-3047
PTL 2: Japanese Unexamined Patent Application Publication No. 9-208704
PTL 3: Japanese Unexamined Patent Application Publication No. 8-262728
PTL 4: International Publication No. 00/48044
NPL 1: Chemistry of Materials 1989, 1, 163
NPL 2: J. Mater. Chem. 4 (1994) 1769
NPL 3: Journal of Polymer Science: Part A: Polymer Chemistry 45, (2007) 776

SUMMARY OF INVENTION

Technical Problem

Attempts to form a phosphor layer by using the technologies described in these patent publications, however, have resulted in the degradation of the phosphor material during pattering and a loss of the material's intended luminous performance in some cases.

These problems are not unique to phosphor materials but are common to any material that absorbs light and emits light of a different wavelength, such as phosphorescent materials.

The aspect of the present invention was made in light of these circumstances and is intended to limit the degradation of wavelength conversion materials including phosphor materials and to provide a photosensitive resin composition that can be used to form wavelength conversion units, such as phosphor layers, with good luminous performance.

The aspect of the present invention is also intended to provide a wavelength conversion substrate that includes a wavelength conversion unit formed from such a photosensitive resin composition and offering good luminous performance A light emitting device that includes such a wavelength conversion substrate is also contemplated.

Solution to Problem

To solve the aforementioned problems, an aspect of the present invention provides a photosensitive resin composition. The photosensitive resin composition includes a positive photosensitive resin having a photosensitive moiety that cleaves upon exposure to light, and a wavelength conversion material dispersed in the photosensitive resin. The photosensitive resin and the wavelength conversion material meet the following (i) to (iv):

(i) The photosensitive moiety and a cleavage product of the photosensitive resin do not neutralize the wavelength conversion material;

(ii) The photosensitive moiety and the cleavage product do not induce hydrolysis of the wavelength conversion material;

(iii) HOMOs of the photosensitive moiety and the cleavage product are lower than a LUMO of the wavelength conversion material; and (iv) LUMOs of the photosensitive moiety and the cleavage product are higher than a HOMO of the wavelength conversion material.

(Any combination of a chemically amplified photosensitive resin with an acidic photosensitive moiety or cleavage product and an acidic wavelength conversion material is excluded.)

In an aspect of the present invention, the photosensitive moiety and the cleavage product of the photosensitive resin may be neutral.

In an aspect of the present invention, the photosensitive moiety of the photosensitive resin may include at least one selected from the group consisting of cyclobutane diimide, o-nitrobenzyl amide, o-nitrobenzyl ether, methyl phenyl carbonate, 1-benzyloxy-1-alkyl ethanol, and disilane structures.

In an aspect of the present invention, the photosensitive moiety of the photosensitive resin may be a cyclobutane diimide structure.

In an aspect of the present invention, the wavelength conversion material may have a proton-accepting or proton-donating group.

In an aspect of the present invention, the wavelength conversion material may have a dehydration-condensable group.

In an aspect of the present invention, the wavelength conversion material may have a coumarin or boron-dipyrromethene structure.

In an aspect of the present invention, the photosensitive resin may have transparency for light of a visible spectrum.

In an aspect of the present invention, the photosensitive resin composition may further include a solvent that dissolves the photosensitive resin.

An aspect of the present invention provides a wavelength conversion substrate. The wavelength conversion substrate includes a substrate and a wavelength conversion unit provided on the substrate. The wavelength conversion unit is formed from a photosensitive resin composition described above.

An aspect of the present invention provides a light emitting device. The light emitting device includes the wavelength conversion unit described above and a light source that emits excitation light to the wavelength conversion unit.

In an aspect of the present invention, the light emitting device may include a wavelength conversion substrate that includes a substrate and the wavelength conversion unit provided on the substrate.

In an aspect of the present invention, the wavelength conversion substrate may include a structural body that abuts the wavelength conversion unit on at least one side thereof and reflects or diffuses light emitted from the wavelength conversion unit.

In an aspect of the present invention, the structural body may be formed from a material including a metallic material.

In an aspect of the present invention, the wavelength conversion unit of the light emitting device may exhibit an internal quantum yield for light emission of 80% or more.

In an aspect of the present invention, the wavelength conversion substrate may include multiple wavelength conversion units arranged in a matrix, the multiple wavelength conversion units having a density of 450 ppi or more.

Advantageous Effects of Invention

The aspect of the present invention offers limited degradation of wavelength conversion materials and provides a photosensitive resin composition that can be used to form wavelength conversion with good luminous performance. The aspect of the present invention can also provide a wavelength conversion substrate that includes a wavelength conversion unit formed from such a photosensitive resin composition and offering good luminous performance. A light emitting device that includes such a wavelength conversion substrate is also contemplated.

DESCRIPTION OF EMBODIMENTS

Figure 1:
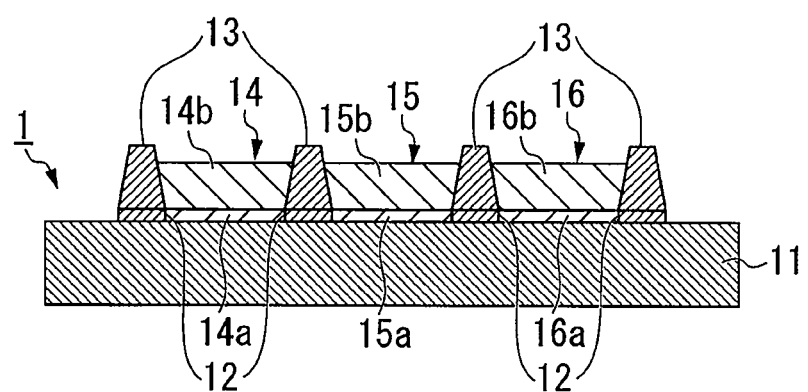
FIG. 1 is a cross-sectional schematic of a phosphor substrate which is one example of an aspect of a wavelength conversion substrate of the present invention.

In the following description herein, "a material that absorbs light and emits light of a different wavelength" may be referred to as "a wavelength conversion material."

A functional unit that includes a wavelength conversion material and that absorbs light and emits light of a different wavelength may be referred to as "a wavelength conversion unit."

A structural element that includes a substrate and wavelength conversion unit may be referred to as "a wavelength conversion substrate."

Embodiment 1

<Photosensitive Resin Composition>

A photosensitive resin composition according to Embodiment 1 of the present invention includes a positive photosensitive resin and a wavelength conversion material.

(Photosensitive Resin)

The photosensitive resin used in the photosensitive resin composition according to this embodiment is a positive photosensitive resin that has a photosensitive moiety that cleaves upon exposure to light.

When cleaved, the photosensitive resin in this embodiment causes a reduction of the molecular weight of the photosensitive resin or a generation of a functional group with which the resin is soluble in certain solvents. The photosensitive resin in this embodiment therefore is a positive photosensitive resin which becomes soluble in certain solvents once exposed to light.

Chemically amplified photosensitive resins, a group of known positive photosensitive resins, are solubilized in certain solvents through photochemical reaction of an additive compound or part of the photosensitive resin itself, which generates a chemical species, and subsequent chemical reaction of the resulting chemical species with the photosensitive resin initiated by heating or any other treatment. The process of solubilizing a chemically amplified photosensitive resin therefore involves at least two steps of chemical reaction, (1) photochemical reaction of an additive compound or part of the photosensitive resin itself and (2) the reaction to make the photosensitive resin soluble. When a chemically amplified photosensitive resin is used in combination with a wavelength conversion material, thus, the selection of the wavelength conversion material needs to be preceded by full consideration of the potential effects of the chemical reactions that occur in the course of the solubilization of the photosensitive resin and those of the chemical species produced by the chemical reactions.

By contrast, photosensitive resins according to this embodiment only require one step of chemical reaction, i.e., cleavage, to solubilize. The wavelength conversion material can therefore be selected with fewer chemical reactions of photosensitive resin to be considered than in combination with a chemically amplified photosensitive resin, providing more choices of wavelength conversion materials. For example, some wavelength conversion materials cannot be used in combination with chemically amplified photosensitive resins but can be used with photosensitive resins according to this embodiment, and photosensitive resins according to this embodiment allow the user to select such a wavelength conversion material.

The photosensitive resin is preferably one that has a neutral photosensitive moiety and gives a neutral product when its photosensitive moiety cleaves upon exposure to light. Such a photosensitive resin is unlikely to react with the wavelength conversion material it coexists with in the photosensitive resin composition and therefore is unlikely to degrade the wavelength conversion material. "Neutral" as used herein denotes the range from a weakly acidic pH of 6 to a weakly acidic pH of 8 (pH 6 to 8).

The photosensitive moiety of the photosensitive resin preferably includes at least one selected from the group consisting of cyclobutane diimide, o-nitrobenzyl amide, o-nitrobenzyl ether, methyl phenyl carbonate, 1-benzyloxy-1-alkyl ethanol, and disilane structures.

A specific example of a cyclobutane diimide structure that can be used as a photosensitive moiety of the photosensitive resin is the structure of formula (1) (the N,N'-diphenylcyclobutane diimide structure).

[Chem. 1]

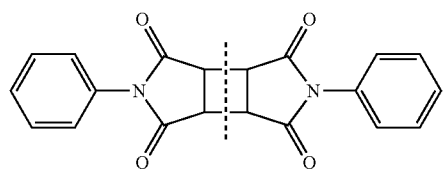 [SMILES: O=C1C2C(C(=O)N1c1ccccc1)C1C(=O)N(c3ccccc3)C(=O)C21]

(1)

In formula (1), the dotted line (-----) indicates the site of light-induced cleavage. The structure of formula (1) cleaves according to the chemical equation of equation (a1) by absorbing light with a center wavelength of 254 nm.

[Chem. 2]

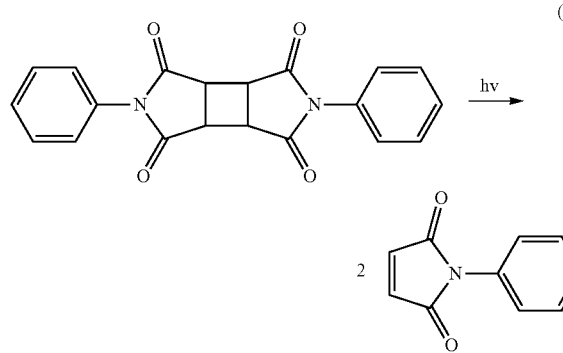

(a1)

The structure of formula (1) is included in the backbone and/or side chains of the photosensitive resin as a result of having one or more hydrogen atoms substituted with an atom that is a component of the backbone or side chains of the photosensitive resin.

To take an example, equation (101) represents the cleavage of a photosensitive moiety that includes the chemical structure of formula (1) as a photosensitive moiety. In equation (101), the photosensitive resin of formula (a) binds to the photosensitive resin at its two phenylene groups, one on one side of the dotted line (-----) in formula (1) and the other on the other side, thereby being included in the photosensitive resin.

[Chem. 3]

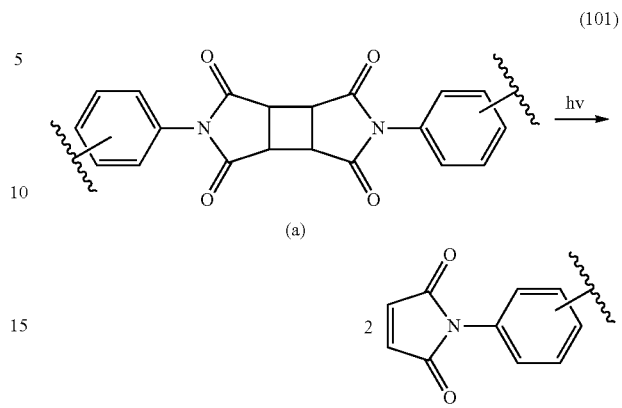

(101)

In the photosensitive resin of formula (a) opens, its cyclobutane ring is opened by absorbing light with the center wavelength specified above, giving a cleavage product.

A specific example of an o-nitrobenzyl amide structure that can be used as a photosensitive moiety of the photosensitive resin is the structure of formula (2). The structure of formula (2) cleaves at the site indicated by the dotted line according to the chemical equation of equation (a2) by absorbing light with a center wavelength of 365 nm.

[Chem. 4]

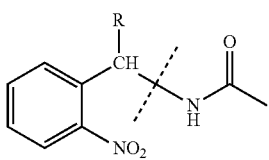

(2)

(In the formula, R represents a hydrocarbon group or a hydrogen atom.)

[Chem. 5]

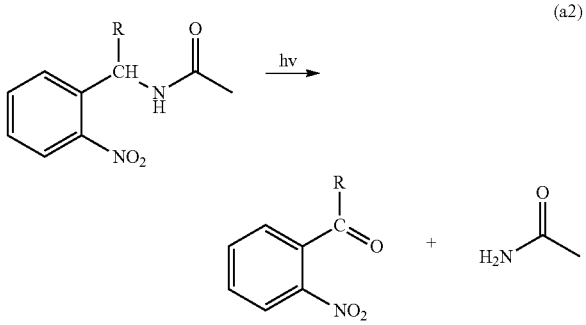

(a2)

A specific example of an o-nitrobenzyl ether structure that can be used as a photosensitive moiety of the photosensitive resin is the structure of formula (3). The structure of formula (3) cleaves at the site indicated by the dotted line according to the chemical equation of equation (a3) by absorbing light with a center wavelength of 365 nm.

[Chem. 6]

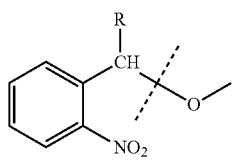
(3)

(In the formula, R represents a hydrocarbon group or a hydrogen atom.)

[Chem. 7]

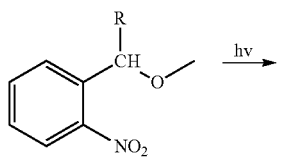 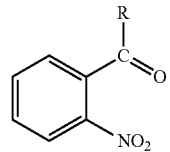
(a3)

The structures of formulae (2) and (3) are included in the backbone and/or side chains of the photosensitive resin as a result of having a hydrogen atom in formula (2) or (3) substituted in a position where the substitution does not inhibit the cleavage (any hydrogen atom excluding that in the benzylic position) on each side of the dotted line (-----) in formula (2) or (3).

A specific example of a methyl phenyl carbonate structure that can be used as a photosensitive moiety of the photosensitive resin is the structure of formula (4). The structure of formula (4) cleaves at the site indicated by the dotted lines according to the chemical equation of equation (a4) by absorbing light with a center wavelength of 254 nm.

[Chem. 8]

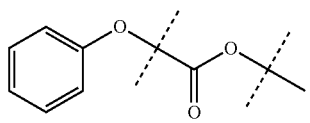
(4)

[Chem. 9]

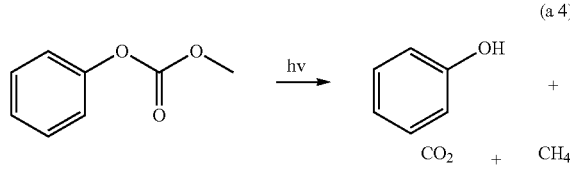
(a4)

The structure of formula (4) is included in the backbone and/or side chains of the photosensitive resin as a result of having a hydrogen atom in the methyl or phenyl group in formula (4) substituted.

A specific example of a 1-benzyloxy-1-alkyl ethanol structure that can be used as a photosensitive moiety of the photosensitive resin is the structure of formula (5). The structure of formula (5) cleaves at the site indicated by the dotted lines according to the chemical equation of equation (a5) by absorbing light with a center wavelength of 248 nm.

[Chem. 10]

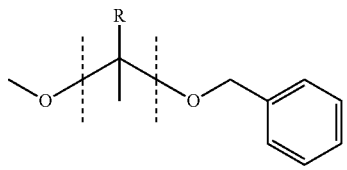
(5)

(In the formula, R represents a hydrocarbon group or a hydrogen atom.)

[Chem. 11]

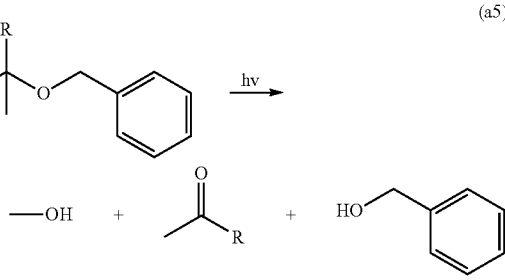
(a5)

The structure of formula (5) is included in the backbone and/or side chains of the photosensitive resin as a result of having a hydrogen atom substituted on each side of the dotted line (-----) in formula (5).

A specific example of a disilane structure that can be used as a photosensitive moiety of the photosensitive resin is the structure of formula (6). The structure of formula (6) cleaves at the site indicated by the dotted line according to the chemical equation of equation (a6) by absorbing light with a center wavelength of 254 nm.

[Chem. 12]

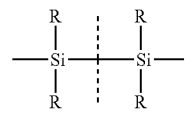
(6)

(In the formula, R represents a hydrocarbon group or a hydrogen atom.)

[Chem. 13]

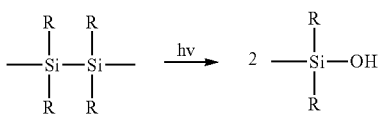
(a6)

The structure of formula (6) is included in the backbone and/or side chains of the photosensitive resin as a result of having a hydrogen atom substituted or as a result that the silicon atom directly binds to the photosensitive resin on each side of the dotted line (-----) in formula (6).

The photosensitive resin preferably has a cyclobutane diimide structure. Thermal imidization of a cyclobutane-bearing precursor polyamic acid gives a photosensitive resin having a cyclobutane diimide structure. When a resin film is formed using the photosensitive resin composition, thus, it is possible to use a cyclobutane-bearing polyamic acid and imidize it before patterning. Patterning this resin film leaves a film of a photosensitive resin having a cyclobutane diimide structure.

In general, polyamic acids are more soluble in solvents than the resins obtained through the imidization of the polyamic acids (polyimides). The use of a polyamic acid during the formation of a resin film therefore provides an easy way to form a resin film of uniform quality because the coating is formed through the application of a solution of the polyamic acid.

The resulting polyimide is practically insoluble, and formed wavelength conversion units are therefore unlikely to be degraded even if they subsequently proceed to a step that uses a wet process. This gives the step higher flexibility. Furthermore, polyimides are more resistance to chemicals and less likely to be degraded than polyamic acids. The resin film left after patterning is therefore stable and unlikely to be degraded.

Preferably, the photosensitive resin has transparency for light of the visible spectrum. It is also preferred that the photosensitive resin be colorless and transparent. This ensures that the "wavelength-converted light" emitted from the wavelength conversion material is taken out in a favorable fashion.

The wavelength conversion material used in the photosensitive resin composition according to this embodiment disperses in the photosensitive resin described above and provides a component of the photosensitive resin composition. The "wavelength conversion material" in an aspect of the present invention includes phosphor materials and phosphorescent materials.

(Phosphor Materials)

The phosphor material used in the photosensitive resin composition according to this embodiment disperses in the photosensitive resin described above and is a component of the photosensitive resin composition.

Phosphor materials that can be used in the photosensitive resin composition according to an aspect of the present invention include known organic and inorganic phosphor materials.

For organic phosphor materials, examples of blue fluorescent dyes include:

styrylbenzene dyes such as 1,4-bis(2-methylstyryl)benzene and trans-4,4'-diphenyl styrylbenzene;

coumarin dyes such as 7-hydroxy-4-methyl coumarin, ethyl 2,3,6,7-tetrahydro-11-oxo-1H,5H,11H-[1]benzopyrano[6,7,8-ij]quinolizine-10-carboxylate (coumarin 314), and 10-acetyl-2,3,6,7-tetrahydro-1H,5H,11H-[1]benzopyrano[6,7,8-ij]quinolizin-11-one (coumarin 334);

anthracene dyes such as 9,10-bis(phenylethynyl)anthracene; and perylene.

Examples of green fluorescent dyes include:

coumarin dyes such as 2,3,5,6-1H,4H-tetrahydro-8-trifluoromethylquinolizino(9,9a,1-gh)coumarin (coumarin 153), 3-(2'-benzothiazolyl)-7-diethyl aminocoumarin (coumarin 6), 3-(2'-benzimidazolyl)-7-N,N-diethyl aminocoumarin (coumarin 7), 10-(benzothiazol-2-yl)-2,3,6,7-tetrahydro-1H,5H,11H-[1]benzopyrano[6,7,8-ij]quinolizin-11-one (coumarin 545), coumarin 545T, and coumarin 545P;

boron-dipyrromethene (BODIPY) dyes such as BODIPY 493/503, BODIPY FL-X, BODIPY FL, BODIPY R6G, and BODIPY 530/550;

naphthalimide dyes such as Basic Yellow 51, Solvent Yellow 11, Solvent Yellow 98, Solvent Yellow 116, Solvent Yellow 43, and Solvent Yellow 44;

perylene dyes such as Lumogen Yellow, Lumogen Green, and Solvent Green 5;

fluorescein dyes; azo dyes; phthalocyanine dyes; anthraquinone dyes; quinacridone dyes; isoindolinone dyes; thioindigo dyes; and dioxazine dyes.

Examples of red fluorescent dyes include:

4-dicyanomethylene-2-methyl-6-(p-dimethylaminostyryl)-4H-pyran (DCM) dyes such as DCM, DCM-2, and DCJTB;

pyridine dyes such as 1-ethyl-2-[4-(p-dimethylaminophenyl)-1,3-butadienyl]-pyridinium-perchlorate (pyridine 1);

xanthene dyes such as Rhodamine 640 (R640), Rhodamine B, Rhodamine 6g, Rhodamine 3b, Rhodamine 101, Rhodamine 110, Basic Violet 11, Sulforhodamine 101, Basic Violet 11, and Basic Red 2;

boron-dipyrromethene (BODIPY) dyes such as BODIPY TR-X, BODIPY 630/650-X, and BODIPY 650/665-X;

perylene dyes such as Lumogen Orange, Lumogen Pink, Lumogen Red, and Solvent Orange 55;

oxazine dyes; chrysene dyes; thioflavin dyes; pyrene dyes; anthracene dyes; acridone dyes; acridine dyes; fluorene dyes; terphenyl dyes; ethene dyes; butadiene dyes; hexatriene dyes; oxazole dyes; coumarin dyes; stilbene dyes; triphenylmethane dyes; thiazole dyes; thiazine dyes; naphthalimide dyes; and anthraquinone dyes.

When an organic phosphor material is used as a phosphor for any of these colors, it is desirable to use a dye that is unlikely to be degraded by external light, such as excitation light, sunlight, and lighting.

For inorganic phosphor materials, examples of blue phosphors include $Sr_2P_2O_7:Sn^{4+}$, $Sr_4Al_{14}O_{25}:Eu^{2+}$, $BaMgAl_{10}O_{17}:Eu^{2+}$, $SrGa_2S_4:Ce^{3+}$, $CaGa_2S_4:Ce^{3+}$, $(Ba, Sr)(Mg, Mn)Al_{10}O_{17}:Eu^{2+}$, $(Sr, Ca, Ba, Mg)_{10}(PO_4)_6Cl_2:Eu^{2+}$, $BaAl_2SiO_8:Eu^{2+}$, $Sr_2P_2O_7:Eu^{2+}$, $Sr_5(PO_4)_3Cl:Eu^{2+}$, $(Sr, Ca, Ba)_5(PO_4)_3Cl:Eu^{2+}$, $BaMg_2Al_{16}O_{27}:Eu^{2+}$, $(Ba, Ca)_5(PO_4)_3Cl:Eu^{2+}$, $Ba_3MgSi_2O_8:Eu^{2+}$, and $Sr_3MgSi_2O_8:Eu^{2+}$.

Examples of green phosphors include: $(BaMg)Al_{16}O_{27}:Eu^{2+}$, $Mn^{2+}$; $Sr_4Al_{14}O_{25}:Eu^{2+}$; $(SrBa)Al_{12}Si_2O_8:Eu^{2+}$; $(BaMg)_2SiO_4:Eu^{2+}$; $Y_2SiO_5:Ce^{3+}$, $Tb^{3+}$; $Sr_2P_2O_7$—$Sr_2B_2O_5:Eu^{2+}$; $(BaCaMg)_5(PO_4)_3Cl:Eu^{2+}$; $Sr_2Si_3O_8$-$2SrCl_2:Eu^{2+}$; $Zr_2SiO_4$; $MgAl_{11}O_{19}:Ce^{3+}$, $Tb^{3+}$; $Ba_2SiO_4:Eu^{2+}$; $Sr_2SiO_4:Eu^{2+}$; and $(BaSr)SiO_4:Eu^{2+}$.

Examples of red phosphors include $Y_2O_2S:Eu^{3+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P, V)O_4:Eu^{3+}$, $Mg_4GeO_{5.5}F:Mn^{4+}$, $Mg_4GeO_6:Mn^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, and $Na_5Eu_{2.5}(MoO_4)_{6.25}$.

The inorganic phosphor material may be a nanoparticle or quantum dot phosphor. Specific examples include CdSe, ZnS, and mixtures thereof. These phosphors can be made to emit light in different colors by adjusting their particle diameter.

In these groups, phosphor materials having a coumarin or boron-dipyrromethene structure are preferred. High quantum yields for light emission of phosphor materials having these structures allow the user to form a high-performance phosphor layer (wavelength conversion unit). Despite their high quantum yields for light emission, phosphor materials of these structures have been difficult to use in existing photosensitive resins, chemically amplified ones in particular, because of their especially high vulnerability to acids and alkalis. In combination with photosensitive resins according to an aspect of the present invention, however, these phosphor materials can be used without loss of their intended luminous performance.

These phosphor materials can be used either individually or as a combination of two or more.

(Phosphorescent Material)

The phosphorescent material used in the photosensitive resin composition according to this embodiment disperses in the photosensitive resin described above and provides a component of the photosensitive resin composition.

Phosphorescent materials that can be used in the photosensitive resin composition according to an aspect of the present invention include known phosphorescent materials.

Examples of phosphorescent materials that can be used include:

iridium complexes such as tris(2-phenylpyridine)iridium (III) (Ir(ppy)3), bis(2-phenylpyridine)(acetylacetonate)iridium(III) (Ir(ppy)2(acac)), tris[2-(p-tolyl)pyridine]iridium(III) (Ir(mppy)3), bis[(4,6-difluorophenyl)-pyridinato-N,C2']picolinate iridium(III) (FIrPic), bis(4',6'-pyridinato)tetrakis(1-pyrazolyl)borate iridium(III) (FIr6), tris(1-phenyl-3-methylbenzimidazolin-2-ylidene-C,C2')iridium(III) (Ir(Pmb)3), bis(2,4-bifluorophenylpyridinato)(5-(pyridin-2-yl)-1H-tetrazolate)iridium(III) (FIrN4), bis(2-benzo[b]thiophen-2-yl-pyridine)(acetylacetonato)iridium (III) (Ir(btp)2(acac)), tris(1-phenylisoquinoline)iridium(III) (Ir(piq)3), tris(1-phenylisoquinoline)(acetylacetonate)iridium(III) (Ir(piq)2(acac)), bis[1-(9,9-dimethyl-9H-fluoren-2-yl)-isoquinoline](acetylacetonate)iridium(III) (Ir(fliq)2(acac)), bis[2-(9,9-dimethyl-9H-fluoren-2-yl)-isoquinoline](acetylacetonate)iridium(III) (Ir(flq)2(acac)), tris(2-phenylquinolin)iridium(III) (Ir(2-phq)3), and tris(2-phenylquinoline)(acetylacetonate)iridium(III) (Ir(2-phq)2(acac));

osmium complexes such as bis(3-trifluoromethyl-5-(2-pyridyl)-pyrazolate)(dimethylphenylphosphine)osmium (Os(fppz)2(PPhMe2)2) and bis(3-trifluoromethyl)-5-(4-tert-butylpyridyl)-1,2,4-triazolate)(diphenylmethylphosphine)osmium (Os(bpftz)2(PPh2Me)2);

platinum complexes such as 5,10,15,20-tetraphenyltetrabenzoporphyrin platinum; and europium complexes such as tris(trifluoroacetylacetonate)europium(III), tris(1,1,1,2,2,3,3-heptafluoro-7,7-dimethyl-4,6-octanedionate)mono(1,10-phenanthrolinate)europium(III), tris(trifluoroacetylacetonate)mono(1,10-phenanthrolinate)europium(III), and tris(trifluoroacetylacetonate)mono(tetramethyl-phenanthrolinate)europium(III).

These phosphorescent materials can be used either individually or as a combination of two or more.

(Photosensitive Resin Composition)

The photosensitive resin composition according to this embodiment is obtained by selecting each of the photosensitive resin and the wavelength conversion material to avoid chemical reaction. Specifically, the photosensitive resin and the wavelength conversion material meet the following (i) to (iv).

(i) The photosensitive moiety and the cleavage product of the photosensitive resin do not neutralize the wavelength conversion material.

(ii) The photosensitive moiety and the cleavage product do not induce hydrolysis of the wavelength conversion material.

(iii) The HOMOs (Highest Occupied Molecular Orbitals) of the photosensitive moiety and the cleavage product are lower than the LUMO (Lowest Unoccupied Molecular Orbital) of the wavelength conversion material.

(iv) The LUMOs of the photosensitive moiety and the cleavage product are higher than the HOMO of the wavelength conversion material.

(Any combination of a chemically amplified photosensitive resin with an acidic photosensitive moiety or cleavage product and an acidic wavelength conversion material is excluded.)

The following describes these conditions one by one.

When the photosensitive resin and the wavelength conversion material meet condition (i), neutralization-related alteration of the wavelength conversion material is prevented. This limits the degradation of the wavelength conversion material.

There are three possible combinations that meet condition (i):

(i-a) All of the photosensitive moiety, the cleavage product, and the wavelength conversion material are acidic;

(i-b) All of the photosensitive moiety, the cleavage product, and the wavelength conversion material have a pH of 7; and (i-c) All of the photosensitive moiety, the cleavage product, and the wavelength conversion material are basic.

As long as condition (i) is met, the wavelength conversion material may have a proton-accepting or proton-donating group.

When the photosensitive resin and the wavelength conversion material meet condition (ii), hydrolytic alteration of the wavelength conversion material is prevented. This limits the degradation of the wavelength conversion material. As long as condition (ii) is met, the wavelength conversion material may have a dehydration-condensable group.

"Hydrolysis" here refers to a reaction between water that comes from outside the wavelength conversion unit or remains in the unit and the wavelength conversion material.

In condition (ii) "do not induce hydrolysis of the wavelength conversion material" means that neither the photosensitive moiety nor the cleavage product of the photosensitive resin is a catalyst for the hydrolysis of the wavelength conversion material (a reaction between water and the wavelength conversion material).

In general, this hydrolysis is very slow and unusual. If the photosensitive moiety or the cleavage product is an acid or an alkali, however, the acid or alkali can accelerate the hydrolysis as a catalyst. With an existing photosensitive resin, an acid or an alkali that forms during the step of patterning could alter and degrade the wavelength conversion material by hydrolyzing a dehydration-condensable group of the material, such as an ester, amide, imide, or ether group. Meeting condition (ii) limits the degradation of the wavelength conversion material.

When the photosensitive resin and the wavelength conversion material meet condition (iii), the wavelength conversion material is not reduced due to electron transfer from the HOMOs of the photosensitive resin and the cleavage product to the LUMO of the wavelength conversion material. This limits the degradation of the wavelength conversion material.

When the photosensitive resin and the wavelength conversion material meet condition (iv), the wavelength conversion material is not oxidized due to electron transfer from the HOMO of the wavelength conversion material to the LUMOs of the photosensitive resin and the cleavage product. This limits the degradation of the wavelength conversion material.

Table 1 presents examples of HOMO and LUMO energy levels for some photosensitive resin cleavage sites and cleavage products. Table 2 presents examples of HOMO and LUMO energy levels for some wavelength conversion phosphor materials. The energy levels were calculated at the Gaussian 09 B3LYP 6-31+G(d) level.

TABLE 1

| | | | HOMO (eV) | LUMO (eV) |
|---|---|---|---|---|
| 1-1 | Cleavage site | 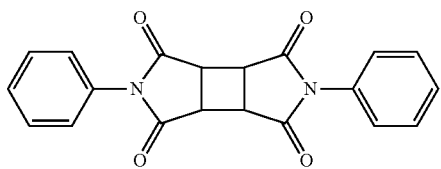 | −7.1565 | −1.6898 |
| 1-2 | Product | 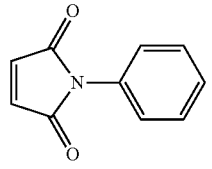 [SMILES: O=C1C=CC(=O)N1c1ccccc1] | −7.3089 | −3.0008 |
| 1-3 | Cleavage site | 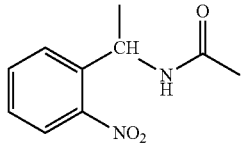 | −7.0324 | −2.9576 |
| 1-4 | Products | 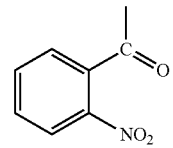 | −7.5818 | −2.4814 |
| 1-5 | |  | −7.4278 | −0.1682 |

TABLE 2

| | | HOMO (eV) | LUMO (eV) |
|---|---|---|---|
| 2-1 | 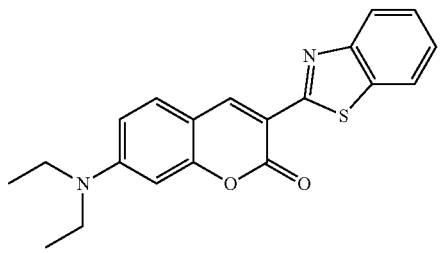 | −5.6466 | −2.1837 |

(Coumarin 6)

TABLE 2-continued

| | | HOMO (eV) | LUMO (eV) |
|---|---|---|---|
| 2-2 | 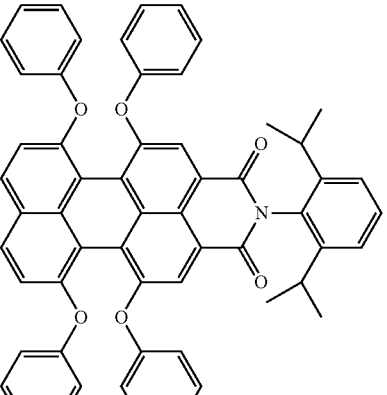<br>(Lumogen Red 305) | −5.6079 | −3.3227 |

As can be seen from these examples, combinations of photosensitive resins that include cleavage site 1-1 in Table 1 (formula (1)) or cleavage site 1-3 in Table 1 (formula (2)) with phosphor materials (wavelength conversion materials) 2-1 and 2-2 in Table 2 meet conditions (iii) and (iv).

The photosensitive resin composition according to this embodiment may further include a solvent that dissolves the photosensitive resin in the photosensitive resin composition. Such a solvent makes the photosensitive resin composition a liquid substance that can be applied to subjects using commonly known printing or coating methods. The solvent therefore provides an easy way to form a wavelength conversion unit.

This is the configuration of a photosensitive resin composition according to this embodiment.

Photosensitive resin compositions configured in such a way offer limited degradation of the wavelength conversion material and can be used to form wavelength conversion units with good luminous performance.

Embodiment 2

<Wavelength Conversion Substrate>

A wavelength conversion substrate according to an aspect of the present invention includes a substrate and a wavelength conversion unit patterned on the substrate. The wavelength conversion unit is formed from a photosensitive resin composition according to an aspect of the present invention.

When formed from a photosensitive resin composition that contains a phosphor material, a wavelength conversion unit may be referred to as a "phosphor layer." A wavelength conversion substrate that has a phosphor layer may be referred to as a "phosphor substrate." The following describes a phosphor substrate as an example of a wavelength conversion substrate, but naturally the wavelength conversion unit may be formed from a photosensitive resin composition that contains a phosphorescent material instead.

An example of a preferred phosphor substrate has two phosphor layers, one for the emission of green light and the other for the emission of red light and one or both formed from a photosensitive resin composition according to an aspect of the present invention. It would be preferred that both of the phosphor layers for green and red light emission be formed from a photosensitive resin composition according to an aspect of the present invention.

FIG. 1 is a cross-sectional schematic of a phosphor substrate which is one example of an aspect of a wavelength conversion substrate of the present invention. The following is a specific description for better understanding of the gist of an aspect of the invention and is not limitations to the aspect of the present invention unless otherwise specified.

In the drawings used in the following description, some major components may be enlarged for the sake of convenience to make the features of an aspect of the present invention more understandable. The individual elements are therefore not necessarily to scale.

The illustrated phosphor substrate 1 has banks 13 on a substrate 11 with a black matrix 12 therebetween. Predetermined regions on the substrate 11 separated by the banks 13 are subpixels. In these separated regions on the substrate 11, there is a phosphor layer 14b on a red color filter 14a, and there is a phosphor layer 15b on a green color filter 15a. In addition to these, there is on a blue color filter 16a a light-scattering layer 16b to scatter blue light. The red color filter 14a and the phosphor layer 14b form a red pixel 14, the green color filter 15a and the phosphor layer 15b form a green pixel 15, and the blue color filter 16a and the light-scattering layer 16b form a blue pixel 16. The phosphor substrate 1 has a matrix of multiple phosphor layers 14b and 15b (wavelength conversion units).

For the substrate 11, examples include those that have an optical transmittance of 90% or more, such as inorganic material substrates formed from glass, quartz, or similar; plastic substrates formed from polyethylene terephthalate, polycarbazole, polyimide, or similar; plastic substrates with an inorganic coating on their surface; and insulating substrates, e.g., ceramic substrates formed from alumina or similar, but are not limited to these. For stressless formation of curved or bent portions, plastic substrates are preferred in particular, and plastic substrates with an inorganic coating are more preferred.

Organic EL elements, for example, are known to be degraded even by a small amount of water or oxygen. Organic EL elements that incorporate a plastic substrate therefore have the great disadvantage of degradation associated with water and oxygen penetrating through this substrate. By contrast, plastic substrates with an inorganic coating are highly effective in blocking water and oxygen. Such a substrate, when applied to organic EL elements, provides a high degree of prevention of the water- and oxygen-induced degradation of the organic EL elements.

The thickness of the substrate 11 is preferably between 10 µm and 2000 µm, more preferably between 100 µm and 1000 µm.

The phosphor substrate 1 preferably includes a black matrix 12. The black matrix 12 is a set of light-absorbing black partitions and further improves the contrast between pixels.

The black matrix 12 can be one formed from a known material, and examples of preferred black matrices include light-shielding ones formed from a resin containing a black pigment.

The thickness of the black matrix 12 (the height perpendicular to the surface of contact with the substrate 11) is preferably between 100 nm and 100 µm, more preferably between 500 nm and 2 µm.

The banks 13 have light-reflecting or surface light-scattering properties. Each phosphor layer isotropically emits fluorescent light, and such banks 13 prevent the declines in color purity that would otherwise be caused by the emission of the lateral component of the isotropic fluorescent light from the next pixels in different colors. The banks 13 also reflect light in the pixels, thereby enabling efficient use of the emitted light and reducing the power consumption.

The banks 13 can be ones in a known material, and examples of preferred banks include light-reflecting ones formed from a resin that contains particles of gold, silver, aluminum, or other metals; and light-scattering ones formed from a resin that contains light-scattering particles such as titanium oxide. The resin can be, for example, epoxy resin, acrylic resin, or silicone resin. A structural body composed of a base resin, such as epoxy resin, acrylic resin, or silicone, and a 10-nm to 1000-nm thick layer of particles such as the aforementioned metal or light-scattering particles placed on the surface of the base resin by vapor deposition or sputtering also provides preferred banks 13.

Light-reflecting or light-scattering banks 13 are "a structural body that reflects or diffuses light emitted from the wavelength conversion unit" in an aspect of the present invention.

As mentioned above, it is particularly preferred that the banks 13 be formed from a material including a metallic material because such banks exhibit high light reflectance. The banks 13 formed from a material "including a metallic material" can be banks formed from a resin composition in which metal particles are dispersed, and can also resin banks with a metal coating thereon. With a known photosensitive resin composition, it has been difficult to allow the banks to exert their full light-reflecting effect because the metal particles are corroded as a result of acid generation and development with an aqueous alkali solution during the patterning of the resin composition.

The photosensitive resin composition according to this embodiment, however, improves in solubility in one step, i.e., cleavage, without producing acid or similar by-products and can be developed using organic solvents. In the wavelength conversion substrate according to this embodiment, thus, it is possible to use banks 13 formed from a metallic material. The use of a photosensitive resin composition according to this embodiment is therefore an easy and reliable way to impart high light reflectance to the banks 13 and thereby to greatly reduce the power consumption.

The height of the banks 13 (perpendicular to the surface of contact with the black matrix 12) is preferably greater than the combined thickness of the color filter and the phosphor layer or that of the color filter and the light-scattering layer in each pixel. This makes the effects described above more noticeable.

The phosphor substrate 1 preferably includes a red color filter 14a and a green color filter 15a. These color filters prevent the component of excitation light that is not absorbed by the phosphor layer 14b or 15b and passes through it from leaking out, thereby preventing the declines in the color purity of the emitted light that would otherwise be caused by the mixing of the light emitted from the phosphor layer 14b or 15b and the excitation light. The increased color purity in each pixel leads to a greater range of colors that the organic EL element can reproduce. Furthermore, the color filters absorb rays of external light that can excite the light emitting substance in the phosphor layers 14b and 15b, thereby controlling the externally induced light emission from the phosphor layers 14b and 15b and limiting the associated lowering of contrast.

The phosphor substrate 1 may include a color filter 16a. This color filter controls the scattering of external light in the light-scattering layer 16b, thereby limiting the associated lowering of contrast. It should be noted that the light-scattering layer 16b is optional because it reduces the transmittance of the light that comes from the organic EL element or the backlight for a display, such as a liquid crystal display or a microelectromechanical system (MEMS) display, as the light source.

The red, green, and blue color filters 14a, 15a, and 16a are ones formed from a known material and are used on an as-needed basis.

The thickness of the red, green, and blue color filters 14a, 15a, and 16a is preferably between 0.5 µm and 10 µm, more preferably between 1 µm and 3 µm.

The illustrated phosphor substrate that includes a phosphor layer 14b that emits red fluorescent light and a phosphor layer 15b that emits green fluorescent light is not the only possible form of a phosphor substrate according to an aspect of the present invention. There may be phosphor layers that emit fluorescent light in different colors, such as one that emits cyan fluorescent light and one that emits yellow fluorescent light. In such a case, there may be color filters for the specific colors.

The materials for (constituents of) the phosphor layers 14b and 15b are as described above.

The thickness of the phosphor layers 14b and 15b is preferably between 100 nm and 100 µm, more preferably between 1 µm and 20 µm. When their thickness is equal to or greater than the specified lower limit, they absorb the excitation light that comes from the excitation light source sufficiently. This improves the luminous efficiency, and limits the deterioration of color purity caused by the mixing of the desired color with unintended light from the excitation light source. Making their thickness equal to or smaller than the specified upper limit leads to reduced cost because excessive thickness is avoided.

The phosphor substrate 1 includes a blue pixel 16 at which the excitation light is directly used, and red and green pixels 14 and 15 that have light distribution properties different from those of the blue pixel 16, i.e., the use of fluorescent light emitted from a phosphor layer. The light-scattering layer 16b works across these pixels with different light distribution properties to reduce the changes in brightness and color that occur while the light distribution properties vary according to viewing angle.

The light-scattering layer 16b can be formed by, for example, curing a binder resin in a curable composition (a light-scattering layer-forming composition) composed of light-scattering particles and a binder resin.

The light-scattering particles can be particles of either an organic material or an inorganic material.

The organic material can be, for example, polymethyl methacrylate (refractive index, 1.49), acrylic resin (refractive index, 1.50), an acrylic-styrene copolymer (refractive index, 1.54), melamine resin (refractive index, 1.57), high-refractive-index melamine resin (refractive index, 1.65), polycarbonate (refractive index, 1.57), polystyrene (refractive index, 1.60), crosslinked polystyrene (refractive index, 1.61), polyvinyl chloride (refractive index, 1.60), benzoguanamine-melamine-formaldehyde resin (refractive index, 1.68), or silicone (refractive index, 1.50).

The inorganic material can be, for example, an oxide of a metal selected from the group consisting of silicon, titanium, zirconium, aluminum, indium, zinc, tin, and antimony, and it is also possible to use oxides of two or more of these metals. Examples of particularly preferred ones include silica (refractive index, 1.44), alumina (refractive index, 1.63), titanium oxide (refractive index, 2.50 (anatase) or 2.70 (rutile)), zirconium dioxide (refractive index, 2.05), zinc oxide (refractive index, 2.00), and barium titanate ($BaTiO_3$) (refractive index, 2.4).

It is particularly preferred that the light-scattering particles be particles of an inorganic material. Inorganic light-scattering particles effectively diffuse or scatter directional light that comes from the outside (e.g., a light emitting element) with a higher degree of isotropy. Such light-scattering particles also make the light-scattering layer 16b more stable against light and heat.

The light-scattering particles are preferably highly transparent ones, preferably composed of a base material with a low refractive index and fine particles with a higher refractive index dispersed in the base material.

The diameter of the light-scattering particles is preferably between 100 nm and 500 nm. When the diameter of the light-scattering particles falls within such a range, the light-scattering layer 16b scatters blue light more effectively by virtue of Mie scattering.

The binder resin is preferably transparent.

The binder resin can be, for example, acrylic resin (refractive index, 1.49), melamine resin (refractive index, 1.57), nylon (refractive index, 1.53), polystyrene (refractive index, 1.60), polycarbonate (refractive index, 1.57), polyvinyl chloride (refractive index, 1.60), polyvinylidene chloride (refractive index, 1.61), polyvinyl acetate (refractive index, 1.46), polyethylene (refractive index, 1.53), polymethyl methacrylate (refractive index, 1.49), medium-density polyethylene (refractive index, 1.53), high-density polyethylene (refractive index, 1.54), polychlorotrifluoroethylene (refractive index, 1.42), or polytetrafluoroethylene (refractive index, 1.35).

For the thickness of the light-scattering layer 16b, the same applies as for that of the phosphor layers 14b and 15b.

The phosphor substrate 1 may have low-refractive-index layers between the color filters (red and green color filters 14a and 15a) and the phosphor layers (phosphor layers 14b and 15b), layers whose refractive index is lower than those of the substrate 11 and the phosphor layers. Likewise, the phosphor substrate 1 may have a low-refractive-index layer between the blue color filter 16a and the light-scattering layer 16b, a layer whose refractive index is lower than those of the substrate 11 and the light-scattering layer 16b.

If the color filters are omitted, there may be between the substrate 11 and the phosphor layers low-refractive-index layers, layers whose refractive index is lower than those of the substrate 11 and the phosphor layers. Likewise, if the blue color filter 16a is omitted, there may be between the substrate 11 and the light-scattering layer 16b, a layer whose refractive index is lower than those of the substrate 11 and the light-scattering layer 16b.

Phosphor substrates occasionally experience a loss of emitted light as a result of traveling of the light emitted from the phosphor layers along the substrate 11 to the lateral sides of the substrate 11. Low-refractive-index layers placed in such positions as specified above reflect, to the phosphor layers side, rays of light incident at angles greater than the critical angle for the low-refractive-index layers. The reflected light is reflected once again by a semitransparent or reflective electrode located in, for example, an organic EL section, and emitted out. This reduces the loss of emitted light, thereby lowering the power consumption of the organic EL element or other light source and improving brightness. Furthermore, there may be between the phosphor layers and the excitation light source, such as an organic EL, a reflective film (e.g., a dielectric multilayer film, a band-pass filter, or an ultrathin metal film) that is permeable to the light that excites the phosphor layers and reflects the light emitted from the phosphor layers. Such a reflective film allows for efficient reflection of the component of light the phosphor produces and emits toward the excitation light source, such as an organic EL.

Examples of materials for the low-refractive-index layers include fluoropolymers (resins that contain fluorine atoms) such as poly(1,1,1,3,3,3-hexafluoroisopropyl acrylate) (refractive index, 1.375), poly(2,2,3,3,4,4,4-heptafluorobutyl methacrylate) (refractive index, 1.383), poly(2,2,3,3,3-pentafluoropropyl methacrylate) (refractive index, 1.395), and poly(2,2,2-trifluoroethyl methacrylate) (refractive index, 1.418); mesoporous silica (refractive index, 1.2); and aerogels (refractive index, 1.05). Alternatively, the low-refractive-index layers can be gaps filled with a gas, such as dry air or nitrogen gas, or evacuated gaps.

The phosphor substrate 1 preferably has a sealing film on each of the phosphor layer 14b, the phosphor layer 15b, and the light-scattering layer 16b. Sealing films provided in such a way greatly limit the degradation of the phosphor and light-scattering layers by reducing the entry of external oxygen and water into the phosphor and light-scattering layers to a great extent. When the phosphor substrate 1 is applied to a display or similar equipment, the sealing films also greatly limit the degradation of organic EL elements by reducing the entry of oxygen and water from the phosphor and light-scattering layers into, for example, an organic EL layer.

Preferably, the phosphor substrate 1 further has planarizing films on the sealing films. When the phosphor substrate is combined with an excitation light source, described hereinafter, planarizing films provided in such a way prevent depletion and improve the adhesion between the excitation light source and the phosphor substrate 1.

The sealing films and the planarizing films can be known ones.

Figure 2:
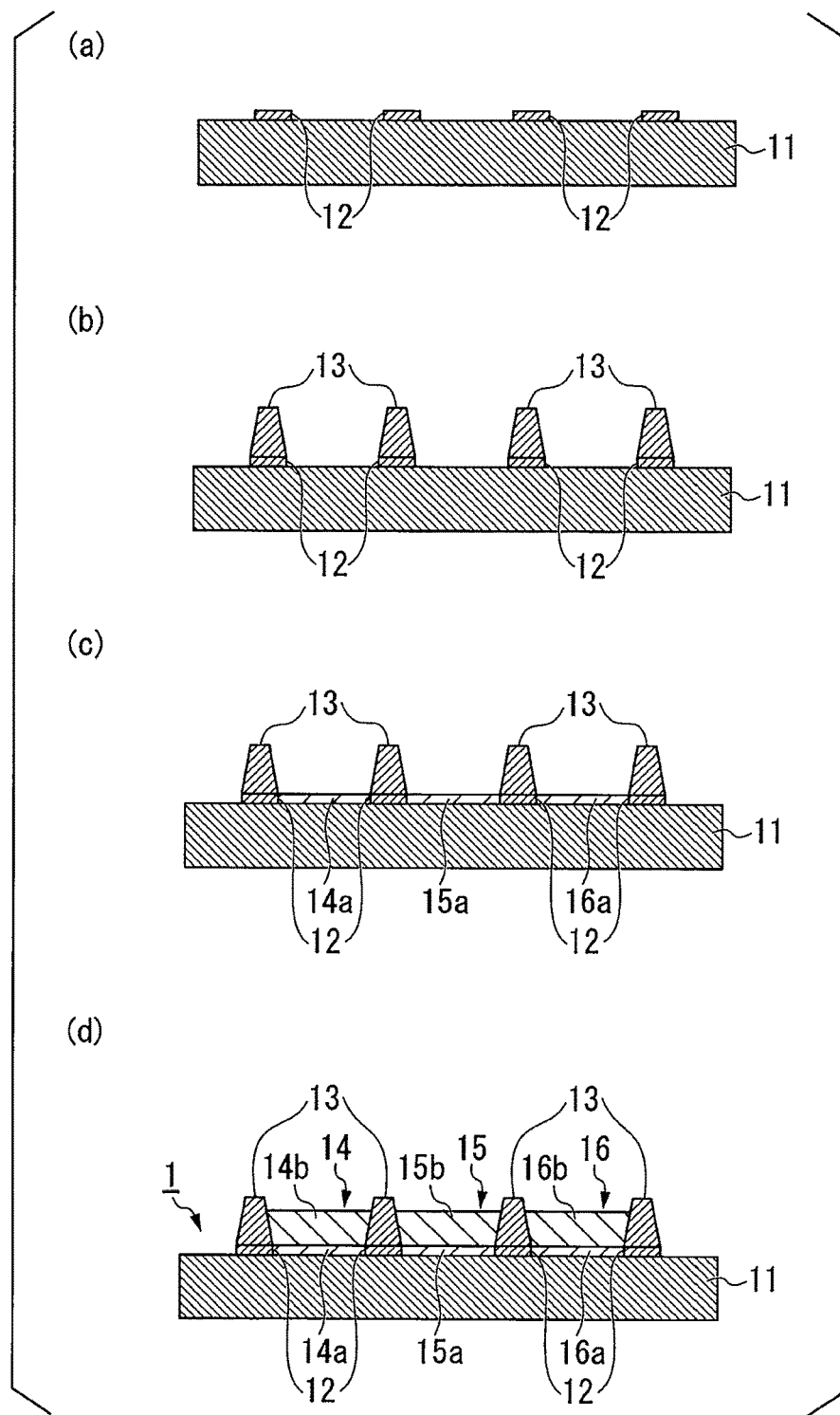
FIG. 2 is a process diagram that illustrates an example of a method for the production of the phosphor substrate.

The process for the production of the phosphor substrate 1 is equivalent to that for a known phosphor substrate except that one or both of the phosphor layers 14b and 15b are formed using a certain photosensitive resin composition described above. The following describes an example of a method for producing the phosphor substrate 1 with reference to FIG. 2. Structural elements in FIG. 2 are referenced by the same numbers as in FIG. 1 and are not described in detail if equivalent elements are illustrated in FIG. 1. This applies to all subsequent drawings.

First, as illustrated in FIG. 2 (a), a black matrix 12 is formed on a substrate 11.

The black matrix 12 can be formed by photolithography. For example, it can be formed by coating the substrate 11 with a curable composition composed of a monomer, a photopolymerization initiator, a black pigment, a binder, and a solvent (a black matrix-forming composition), irradiating the resulting coating with light (exposing the coating to light) with a photomask on the coating to cure desired areas of the coating, and then developing using a developer to complete a pattern. The coating with the curable composition can be performed using coating techniques, such as spin coating. Treatments such as prebaking and postbaking can optionally be carried out. The substrate 11 is optionally washed with, for example, water or an organic solvent before use.

Then, as illustrated in FIG. 2 (b), banks 13 are formed on the black matrix 12.

The banks 13 can be formed by, for example, photolithography in the same way as the black matrix 12, but the curable composition used is one for the formation of the banks, a composition composed of a monomer, a photopolymerization initiator, light-reflecting or light-scattering particles, a binder, and a solvent (a bank-forming composition). Any photomask can be used that has a pattern that allows the banks 13 to be put on the black matrix 12. Alternatively, the banks 13 can be a structural body composed of banks 13 formed from an existing positive or negative photoresist with reflective films such as aluminum films on at least the lateral sides of the structural body. Metal reflective films on the surface of the banks 13 are "a structural body that reflects or diffuses light emitted from the wavelength conversion unit" in an aspect of the present invention.

Then, as illustrated in FIG. 2 (c), red, green, and blue color filters 14a, 15a, and 16a are formed in the respective subpixel regions separated by the banks 13.

The red, green, and blue color filters 14a, 15a, and 16a can be formed by photolithography in the same way as the black matrix 12, but the curable composition used is one from which these color filters can be formed. Any photomask can be used that has a pattern that allows the intended color filters to be formed in the respective subpixel regions.

Then, as illustrated in FIG. 2 (d), a phosphor layer 14b is formed on the red color filter 14a, a phosphor layer 15b is formed on the green color filter 15a, and a light-scattering layer 16b is formed on the blue color filter 16a. The process for the formation of the phosphor layers 14b and 15b is as described above for the formation of phosphor layers.

The light-scattering layer 16b can be formed by, for example, photolithography in the same way as the black matrix 12, but the curable composition used is one for the formation of the light-scattering layer (a light-scattering layer-forming composition) described above.

Any photomask can be used that has a pattern that allows the phosphor layer 14b, the phosphor layer 15b, and the light-scattering layer 16b to be put on the red, green, and blue color filters 14a, 15a, and 16a, respectively.

For these phosphor and light-scattering layers 14b, 15b, and 16b, it is preferred that a single kind of layer be formed at once (e.g., multiple phosphor layers 14b be formed together), and different kinds of layers can be formed in any order.

In this way, a phosphor substrate 1 is obtained. If the phosphor substrate 1 includes the aforementioned low-refractive-index layers, these layers can be formed on the red, green, and blue color filters 14a, 15a, and 16a before the formation of the phosphor and light-scattering layers 14b, 15b, and 16b.

The sealing films can be formed by, for example, applying a resin to the phosphor and light-scattering layers 14b, 15b, and 16b using spin coating, ODF, lamination, or other techniques. The sealing films can also be formed by depositing inorganic films such as SiO, SiON, or SiN films using plasma CVD, ion plating, ion beam treatment, sputtering, or other techniques and then applying a resin to the inorganic films using spin coating, ODF, lamination, or other techniques or attaching resin films to the inorganic films.

This is the configuration of a phosphor substrate according to this embodiment.

Phosphor substrates configured in such a way, formed using an above-described photosensitive resin composition according to an aspect of the present invention, have phosphor layers that exhibit good luminous performance.

Embodiment 3

<Light Emitting Device>

A light emitting device according to an aspect of the present invention includes a light source that emits excitation light and a wavelength conversion unit that absorbs the excitation light and emits light of a wavelength different from the wavelength of the excitation light. The wavelength conversion unit is formed from a photosensitive resin composition described above.

In the light emitting device, the wavelength conversion unit may be on the light source. The light emitting device may have a light source and a wavelength conversion substrate described above.

The light source can be, for example:

(1) organic EL or inorganic EL elements that emit blue or ultraviolet excitation light;

(2) LED elements that emit blue or ultraviolet excitation light;

(3) a liquid crystal substrate that includes a backlight that emits blue or ultraviolet excitation light and liquid crystal elements capable of serving as shutters against light emitted from the backlight; or (4) an MEMS substrate that includes a backlight that emits blue or ultraviolet excitation light and MEMS elements capable of serving as shutters against light emitted from the backlight.

The "blue or ultraviolet excitation light" can be, more specifically, light that falls within the range of ultraviolet to cyan wavelengths (ultraviolet, violet, blue, or cyan light).

In particular, it is preferred to use organic EL elements that emit blue light as the light source because of their low power consumption and high density.

Figure 3:
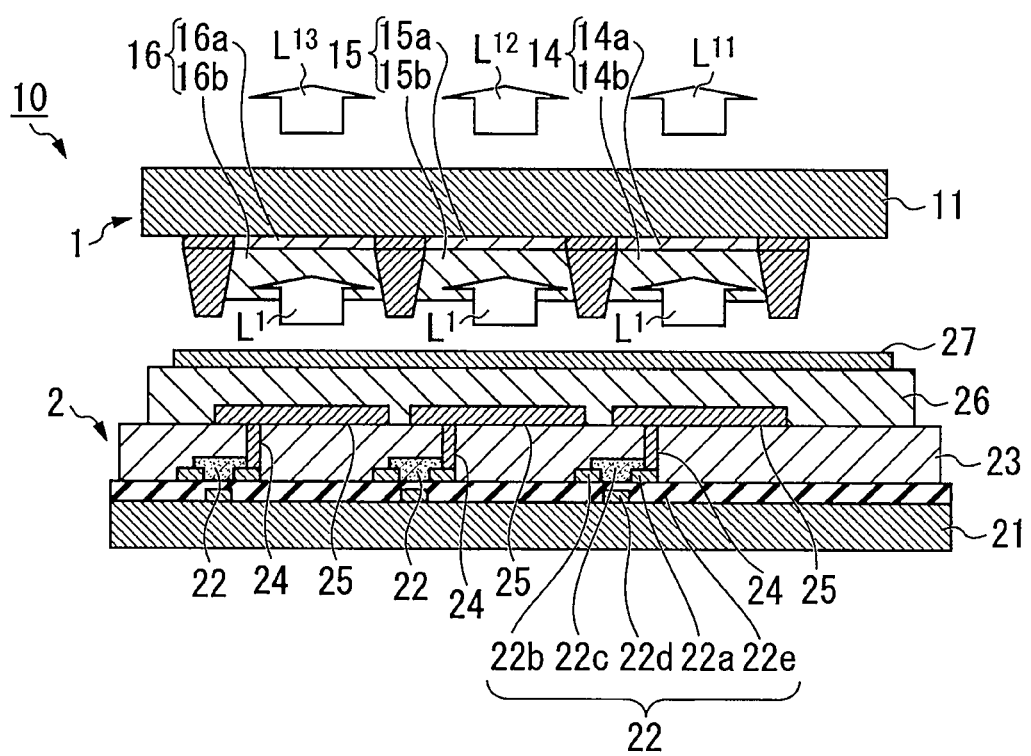
FIG. 3 is a cross-sectional schematic of a light emitting device according to an aspect of the present invention.

FIG. 3 is a cross-sectional schematic of a wavelength-converting light emitting device according to an aspect of the present invention. The illustrated light emitting device 10 is composed of an organic EL substrate 2 and a phosphor substrate 1, illustrated in FIG. 1, bonded thereto. In this drawing, the phosphor substrate 1 and the organic EL substrate 2 are separate from each other for better understanding of the wavelength (color) conversion that occurs in the phosphor substrate 1. Such a light emitting device 10 can be used as an organic EL display.

The organic EL substrate 2 includes organic EL elements each having a substrate 21, a thin-film transistor 22, an interlayer insulating layer 23, an anode (pixel electrode) 25, an organic EL layer 26, and a cathode 27.

On the substrate 21 there is a thin-film transistor 22, and on the thin-film transistor 22 there is an interlayer insulating layer 23. The thin-film transistor 22 includes a source electrode 22a, a drain electrode 22b, a semiconductor layer 22c, a gate electrode 22d, and a gate insulating layer 22e.

The interlayer insulating layer 23 has a contact hole 24 in the region above the source electrode 22a, and the contact hole 24 electrically couples an anode 25 on the interlayer insulating layer 23 to the source electrode 22a.

On the anode 25 there is an organic EL layer 26, and on the organic EL layer 26 there is a cathode 27.

In the drawing, each subpixel has only one thin-film transistor 22 because of limited space. For stable and efficient operation of the organic EL layer 26, there may be multiple thin-film transistors 22 for each subpixel.

The substrate 21 can be, for example, a glass, quartz, or other inorganic substrate. The thickness of the substrate 21 is preferably between 100 μm and 1000 μm.

The semiconductor layer 22c can be, for example, a layer of: amorphous silicon; polycrystalline silicon; an organic semiconductor such as pentacene, polythiophene, or fullerene C60; or an inorganic oxide such as an indium-gallium-zinc oxide. Its thickness is preferably between 20 nm and 200 nm.

The source and drain electrodes 22a and 22b can be, for example: portions of the semiconductor layer 22c doped with phosphorus or other impurity elements; or metal electrodes such as gold, silver, copper, or aluminum electrodes. Their thickness is preferably between 10 nm and 500 nm.

The gate electrode 22d can be, for example: a metal electrode such as a gold, platinum, silver, copper, aluminum, tantalum, or doped silicon electrode; or one formed from organic compounds such as a 3,4-polyethylenedioxythiophene (PEDOT)/polystyrene sulfonate (PSS) electrode. Its thickness is preferably between 20 nm and 200 nm.

The gate insulating layer 22e can be, for example, a layer of: an inorganic compound such as silicon nitride or silicon oxide; or an organic compound such as Cyclotene, Cytop, or Parylene. Its thickness is preferably between 50 nm and 300 nm.

The interlayer insulating layer 23 can be, for example, a layer of: an inorganic compound such as silicon nitride or silicon oxide; or an organic compound such as Cyclotene, Cytop, or Parylene. Its thickness is preferably between 100 nm and 2000 nm.

The anode 25 can be, for example, a stack of a reflective electrode such as a silver or aluminum electrode and a transparent electrode such as an indium oxide-zinc oxide (IZO) electrode, with the reflective electrode on the substrate 21 side. The thickness of the reflective electrode is preferably between 10 nm and 1000 nm, and that of the transparent electrode is preferably between 10 nm and 100 nm.

The organic EL layer 26 can be, for example, a stack of as many of layers such as hole injection, hole transport, blue light emitting, hole-blocking, electron transport, and electron injection layers as needed. The thickness of each layer is preferably selected within the range of 0.5 nm to 200 nm.

The cathode 27 can be, for example: an alloy electrode such as a magnesium silver or aluminum lithium electrode; or a simple metal electrode such as a silver or aluminum electrode, and either monolayer or multilayer electrode can be used. The thickness of the cathode 27 is preferably between 10 nm and 1000 nm.

In the light emitting device 10, excitation light (blue light) L1 emitted from the organic EL substrate 2 reaches the phosphor substrate 1, and this excitation light L1 is converted into red light L11 by the phosphor layer 14b. The excitation light L1 is also converted into green light L12 by the phosphor layer 15b. The red light L11 and the green light L12 leave through the substrate 11 of the phosphor substrate 1 together with blue light L13 that has passed through the light-scattering layer 16b.

The process for the production of the light emitting device 10 is equivalent to that for a known organic EL display except that a phosphor substrate 1 is used. The following describes an example of a method for producing the light emitting device 10 with reference to FIG. 4.

First, an organic EL substrate 2 is fabricated.

Figure 4:
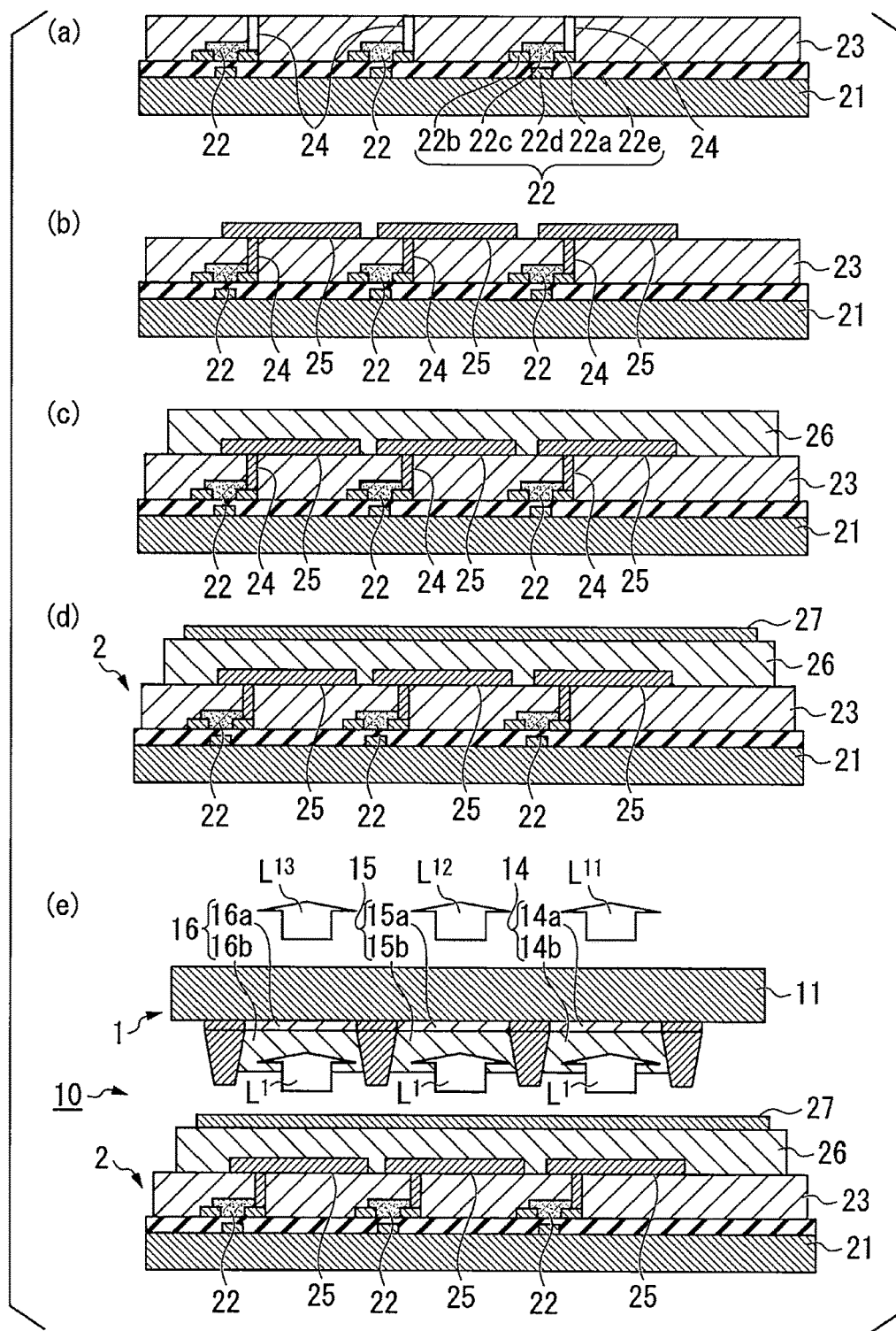
FIG. 4 is a process diagram that illustrates an example of a method for the production of the light emitting device.

As illustrated in FIG. 4 (a), thin film transistors 22 are formed on a substrate 21 through an existing semiconductor process, and an interlayer insulating layer 23 is formed on the substrate 21 to cover the thin-film transistors 22 using sputtering, vacuum deposition, spin coating, inkjet printing, or other printing techniques. The interlayer insulating layer 23 is perforated to create contact holes 24 in the regions above the source electrodes 22a, completing an active-matrix TFT substrate.

Then, as illustrated in FIG. 4 (b), anodes 25 are formed on the interlayer insulating layer 23 and in the contact holes 24 using sputtering or other techniques.

Then, as illustrated in FIG. 4 (c), an organic EL layer 26 is formed on the interlayer insulating layer 23 to cover the anodes 25 using vacuum deposition or other techniques.

Then, as illustrated in FIG. 4 (d), cathodes 27 are formed on the organic EL layer 26 using vacuum deposition or other techniques.

In this way, an organic EL substrate 2 is obtained.

Then, as illustrated in FIG. 4 (e), the resulting organic EL substrate 2 and a phosphor substrate 1 described above are bonded together with the cathodes 27 of the organic EL substrate 2 facing the phosphor and light-scattering layers 14b, 15b, and 16b of the phosphor layer 1.

In this way, a light emitting device 10 is obtained.

Light emitting device configured in such a way, which incorporate an above-described phosphor substrate according to an aspect of the present invention, is capable of high-quality images.

<Electronic Equipment>

A piece of electronic equipment according to an aspect of the present invention includes an above-described light emitting device according to an aspect of the present invention.

Figure 5:
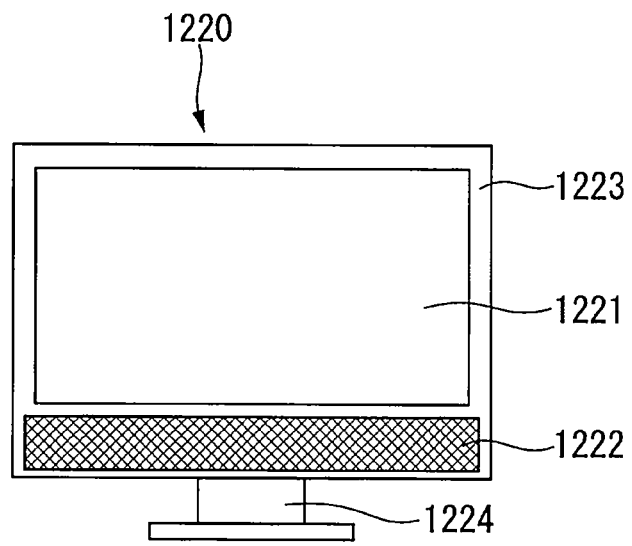
FIG. 5 is a schematic front view of an embodiment of a piece of electronic equipment according to the present invention.

FIG. 5 is a schematic front view of an embodiment of a piece of electronic equipment according to an aspect of the present invention. The illustrated piece of electronic equipment is a television receiver.

The illustrated television receiver 1220 has components such as a screen 1221, speakers 1222, a cabinet 1223, and a stand 1224, and the screen 1221 incorporates an above-described light emitting device (display) according to an aspect of the present invention. The aspect of the present invention is preferred particularly in the case of ultra-high-definition displays, which have a resolution of 7680 pixels horizontal×4320 pixels vertical, with a 60-inch diagonal size because dramatic reductions in power consumption are expected compared with the case of known LCD or organic EL televisions.

With this display, the television receiver 1220 is of low power consumption because of the high internal quantum yield of wavelength conversion units. In the wavelength conversion units the wavelength conversion material is very unlikely to be degraded, further increasing reliability.

Figure 6:
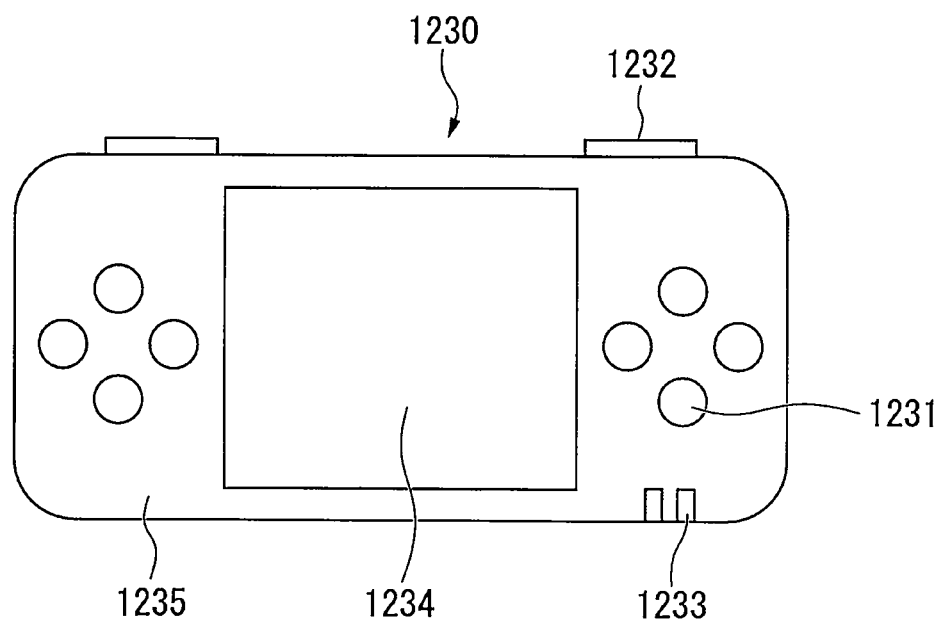
FIG. 6 is a schematic front view of an embodiment of a piece of electronic equipment according to the present invention.

FIG. 6 is a schematic front view of an embodiment of a piece of electronic equipment according to an aspect of the present invention. The illustrated piece of electronic equipment is a handheld game console.

The illustrated handheld game console 1230 has components such as control buttons 1231, an infrared port 1232, LED lamps 1233, a screen 1234, and a casing 1235, and the screen 1234 incorporates an above-described light emitting device (display) according to an aspect of the present invention.

With this display, the handheld game console 1230 is of low power consumption because of the high internal quantum yield of wavelength conversion units. In the wavelength conversion units the wavelength conversion material is very unlikely to be degraded, further increasing reliability.

Figure 7:
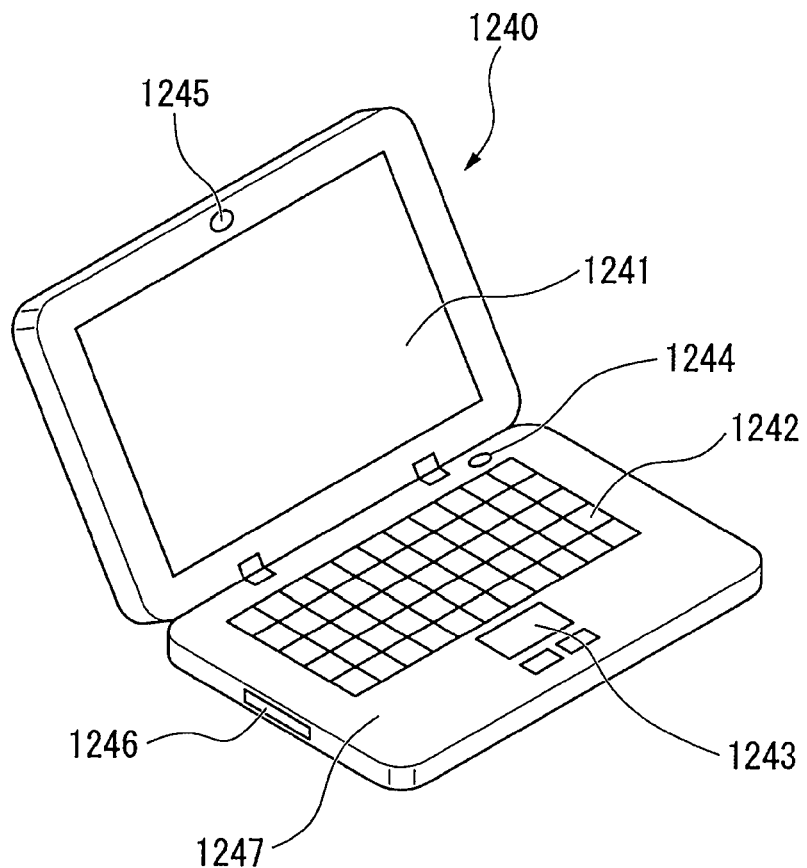
FIG. 7 is a schematic perspective view of an embodiment of a piece of electronic equipment according to the present invention.

FIG. 7 is a schematic perspective view of an embodiment of a piece of electronic equipment according to an aspect of the present invention. The illustrated piece of electronic equipment is a laptop computer.

The illustrated laptop computer 1240 has components such as a screen 1241, a keyboard 1242, a pointing device 1243, a power switch 1244, a camera 1245, an external connection port 1246, and a casing 1247, and the screen 1241 incorporates an above-described light emitting device (display) according to an aspect of the present invention.

With this display, the laptop computer 1240 is of low power consumption because of the high internal quantum yield of wavelength conversion units. In the wavelength conversion units the wavelength conversion material is very unlikely to be degraded, further increasing reliability.

Figure 8:
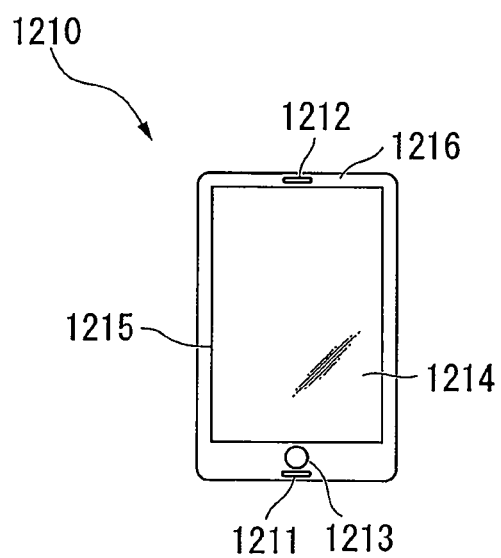
FIG. 8 is a schematic front view of an embodiment of a piece of electronic equipment according to the present invention.

FIG. 8 is a schematic front view of an embodiment of a piece of electronic equipment according to an aspect of the present invention. The illustrated piece of electronic equipment is a smartphone (tablet computer).

The illustrated smartphone 1210 has components such as an audio input 1211, an audio output 1212, a control switch 1213, a screen 1214, a touchpad 1215, and a casing 1216, and the screen 1214 incorporates an above-described light emitting device (display) according to an aspect of the present invention.

With this display, the smartphone 1210 is of low power consumption because of the high internal quantum yield of wavelength conversion units. In the wavelength conversion units the wavelength conversion material is very unlikely to be degraded, further increasing reliability.

Figure 9:
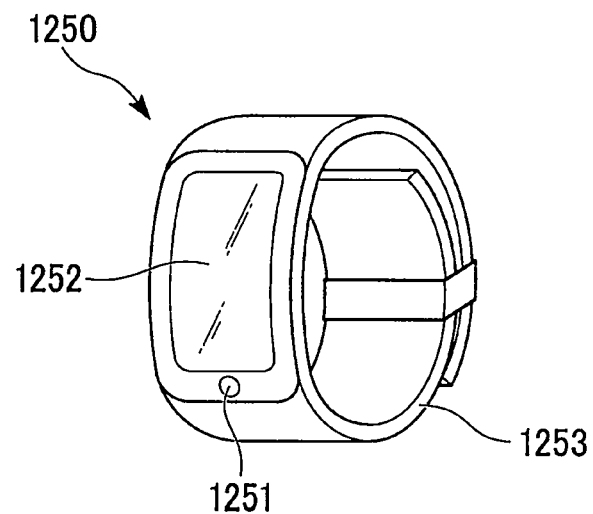
FIG. 9 is a schematic perspective view of an embodiment of a piece of electronic equipment according to the present invention.

FIG. 9 is a schematic perspective view of an embodiment of a piece of electronic equipment according to an aspect of the present invention. The illustrated piece of electronic equipment is a wristwatch-shaped display (wearable computer).

The illustrated wristwatch-shaped display 1250 has components such as a power switch 1251, a screen 1252, and a strap 1253, and the screen 1252 incorporates an above-described light emitting device (display) according to an aspect of the present invention.

With this display, the wristwatch-shaped display 1250 is of low power consumption because of the high internal quantum yield of wavelength conversion units. In the wavelength conversion units the wavelength conversion material is very unlikely to be degraded, further increasing reliability. Furthermore, the display according to an aspect of the present invention offers clear and high-quality images even in use at close distances between the object and eyes by virtue of its high-resolution capability.

Figure 10:
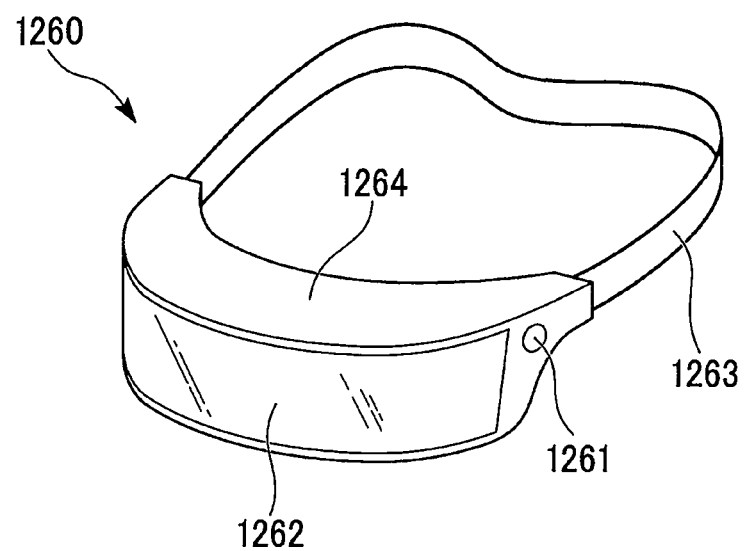
FIG. 10 is a schematic perspective view of an embodiment of a piece of electronic equipment according to the present invention.

FIG. 10 is a schematic perspective view of an embodiment of a piece of electronic equipment according to an aspect of the present invention. The illustrated piece of equipment is a head-mounted display (wearable computer).

The illustrated head-mounted display 1260 has components such as a power switch 1261, a screen 1262, a strap 1263, and a frame 1264, and the screen 1262 incorporates an above-described light emitting device (display) according to an aspect of the present invention.

With this display, the head-mounted display 1260 is of low power consumption because of the high internal quantum yield of wavelength conversion units. In the wavelength conversion units the wavelength conversion material is very unlikely to be degraded, further increasing reliability. Furthermore, the display according to an aspect of the present invention offers clear and high-quality images even in use at close distances between the object and eyes by virtue of its high-resolution capability.

<Light Fixture>

A light fixture according to an aspect of the present invention includes an above-described wavelength conversion substrate according to an aspect of the present invention.

Figure 11:
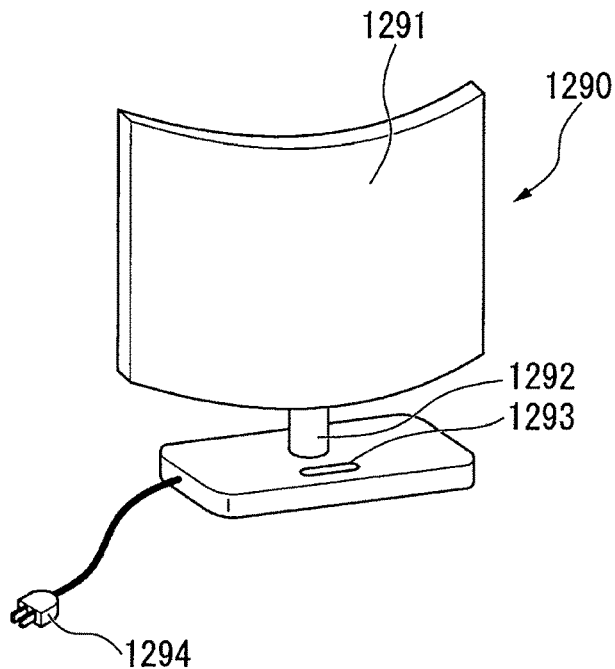
FIG. 11 is a schematic perspective view of an embodiment of a light fixture according to the present invention.

FIG. 11 is a schematic perspective view of an embodiment of a light fixture according to an aspect of the present invention. The illustrated light fixture is a standing lamp.

The illustrated standing lamp 1290 has components such as a lighting unit 1291, a base 1292, a power switch 1293, and a power cable 1294, and the lighting unit 1291 incorporates an above-described wavelength conversion substrate according to an aspect of the present invention.

With this wavelength conversion substrate, the standing lamp 1290 is of low power consumption because of the high internal quantum yield of a wavelength conversion unit. In the wavelength conversion unit the wavelength conversion material is very unlikely to be degraded, further increasing reliability.

Figure 12:
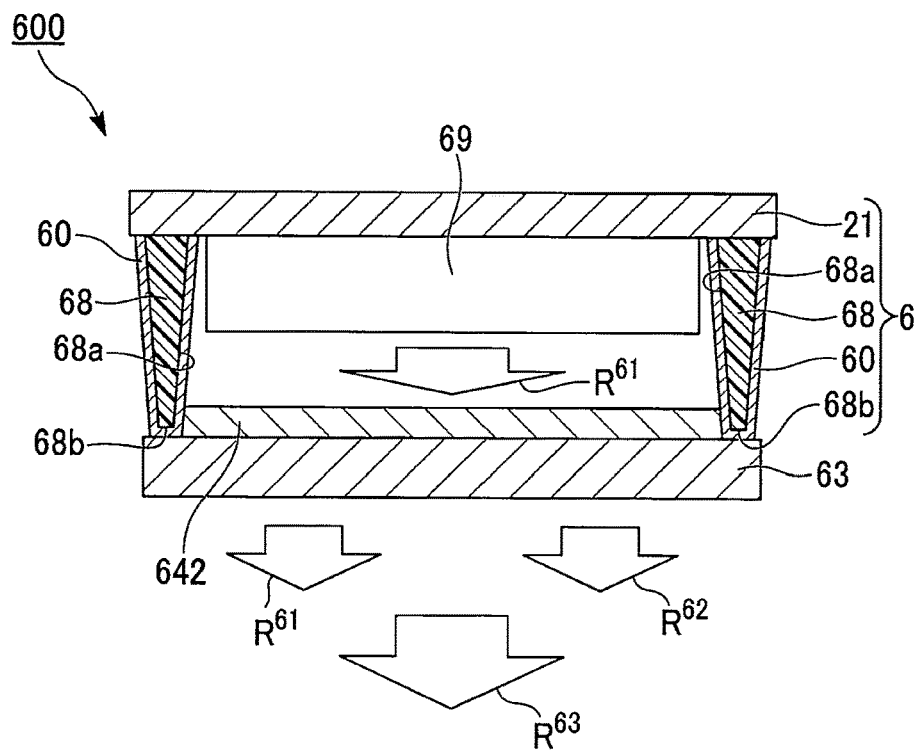
FIG. 12 is a cross-sectional schematic of an embodiment of a light emitting substrate in a light fixture.

An example of a preferred lighting unit 1291 is one illustrated in FIG. 12, which includes a light emitting substrate and a wavelength conversion substrate. FIG. 12 is a cross-sectional schematic of an embodiment of a lighting unit in a light fixture.

The illustrated lighting unit 600 includes a light emitting substrate 6 and a wavelength conversion substrate 63. The light emitting substrate 6 includes a substrate 21 and a light emitting unit 69 thereon, with banks 68 standing on the substrate 21 with reflective layers 60 on their lateral sides 68a and top surface 68b. The banks 68 define the light emitting unit 69. The reflective layers 60 may be limited to the lateral sides 68a of the banks 68 and omitted on the top surfaces 68b in some cases.

The wavelength conversion substrate 63 also includes a wavelength conversion unit 642 facing the light emitting unit 69 in a position where a ray of light from the light emitting unit 69 is incident. The wavelength conversion unit 642 is in firm contact with the reflective layers 60 on the lateral sides 68a of the banks 68 at its periphery. In the drawing, however, the light emitting unit 69 and the wavelength conversion unit 642 are separate from each other for better understanding of their relative arrangement.

The light emitting substrate 6, furthermore, has been bonded to a wavelength conversion substrate 63, which includes the wavelength conversion units 642, to face it.

In the light emitting substrate 6, part of a ray of light $R^{61}$ from the light emitting unit 69 is converted by the wavelength conversion unit 642 into a ray $R^{62}$ having another wavelength. This converted ray $R^{62}$ and the unconverted emitted ray $R^{61}$ generate yet another ray $R^{63}$. The ray of light that finally leaves is this generated ray $R^{63}$.

The light emitting unit 69 can assume any form. For example, it can be either a multilayer structural body composed of an anode, an organic EL layer, and a cathode or a multilayer structural body composed of an anode, an inorganic EL layer, and a cathode.

The wavelength conversion unit 642 includes at least a wavelength conversion material that produces the ray $R^{62}$ and a composition including a molecular-cleavage photosensitive resin.

The type of the wavelength conversion unit 642 can be changed as appropriate for the wavelength of the light that comes from the light emitting unit 69.

An example of a preferred light emitting substrate 6 is one in which the light emitting unit 69 is a blue-light emitting unit and the wavelength conversion unit 642 is a to-yellow wavelength conversion unit, which converts blue light into yellow light. In such a light emitting substrate 6, part of a blue ray of light $R^{61}$ from the light emitting unit 69 (emitted ray) is converted by the wavelength conversion unit (to-yellow wavelength conversion unit) 642 into a yellow ray (converted ray) $R^{62}$. This converted yellow ray $R^{62}$ and the unconverted blue ray $R^{61}$ generate a white ray (generated ray) $R^{63}$. The ray of light that finally leaves is this white ray $R^{63}$. The light emitting substance in the wavelength conversion unit 642 in this case can be a yellow light emitting substance that absorbs blue light and emits yellow light.

<Solar Cell>

A solar cell according to an aspect of the present invention includes an above-described wavelength conversion substrate according to an aspect of the present invention.

Figure 13:
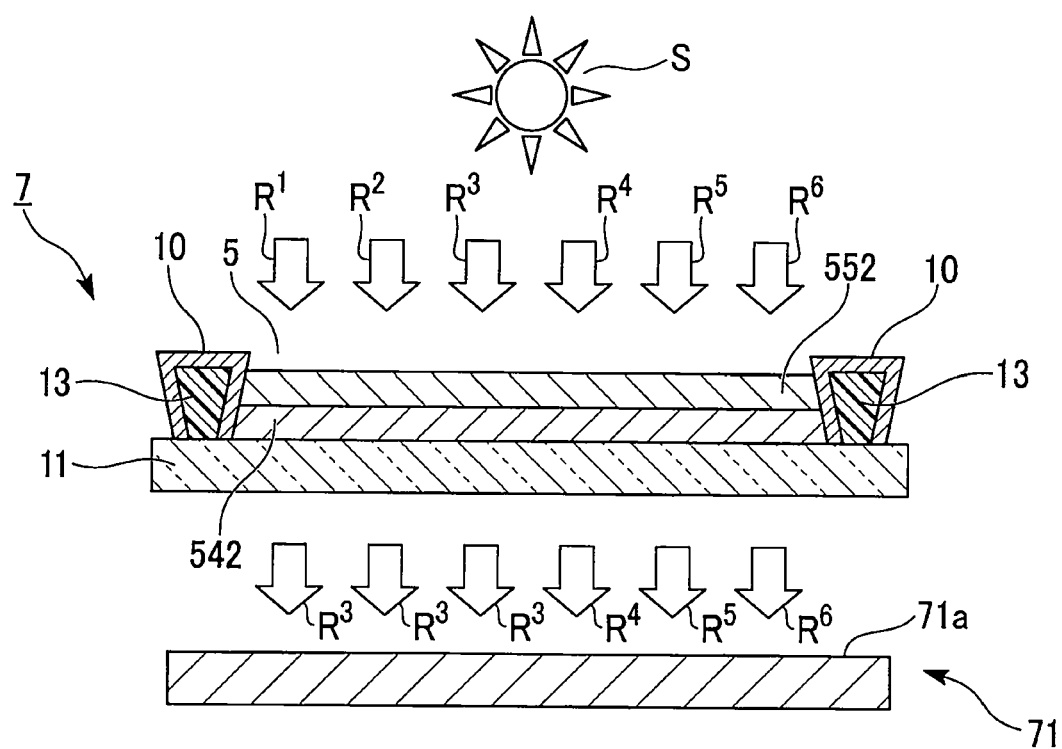
FIG. 13 is a schematic view of major components of an embodiment of a solar cell.

FIG. 13 is a schematic view of major components of an embodiment of a solar cell. It should be understood that solar cells that incorporate a wavelength conversion substrate according to an aspect of the present invention are not limited to the illustrated one.

The illustrated solar cell 7 includes the wavelength conversion substrate 5, a light emitting unit S that is a light source such as the sun or lighting, and a solar cell element 71 facing the wavelength conversion substrate 5.

The wavelength conversion substrate 5 has a second wavelength conversion unit 552 placed to face the sun S. There is a solar cell element 71 positioned to make its surface 71a, which provides a surface on which the light is incident, face the substrate 11 of the wavelength conversion substrate 5. In the drawing, however, the wavelength conversion substrate 5 and the solar cell element 71 are separate from each other for better understanding of their relative arrangement. Only for the wavelength conversion substrate 5 is the illustration a cross-sectional view.

The solar cell element 71 is equivalent to a known solar cell (element).

In the solar cell 7, a predetermined spectrum of light in the sunlight incident on the wavelength conversion substrate 5 is converted into an intended spectrum of light and leaves through the substrate 11, and then the leaving light enters the solar cell element 71 through the surface 71a and generates electricity. The drawing illustrates a wavelength conversion substrate 5 in which the first wavelength conversion unit 542 is a to-green wavelength conversion unit, which converts blue light into green light, and the second wavelength conversion unit 552 is a to-blue wavelength conversion unit, which converts ultraviolet light into blue light. In this case, the ultraviolet ray of light $R^1$ in the sunlight incident on the wavelength conversion substrate 5 is converted by the second wavelength conversion unit (to-blue wavelength conversion unit) 552 into a blue ray, and this converted blue ray and the blue ray $R^2$ in the sunlight are converted by the first wavelength conversion unit (to-green wavelength conversion unit) 542 into a green ray $R^3$. The rays of light that finally leave the wavelength conversion substrate 5 have wavelengths longer than that of blue light, such as a green ray $R^3$, a yellow ray $R^4$, an orange ray $R^5$, and a red ray $R^6$. These spectra of light highly efficient in power generation enter a solar cell element 71, providing a solar cell that is highly efficient in power generation.

In the wavelength conversion units the wavelength conversion material is very unlikely to be degraded, further increasing reliability.

The foregoing has described some examples of preferred embodiments associated with an aspect of the present invention with reference to the attached drawings. Naturally, the aspect of the present invention is not limited to these examples. The shapes, combinations, and other details of the individual components presented in these examples are illustrative, and various modifications can be made according to design requirements or other conditions without departing from the spirit of the aspect of the present invention.

EXAMPLES

The following describes an aspect of the present invention in more detail by providing some examples. However, the aspect of the present invention is not limited to these examples.

Example 1

A polyamic acid having a cyclobutane structure (a photosensitive resin, formula (11)) was synthesized according to NPL 1 (Chemistry of Materials 1989, 1, 163). The resulting polyamic acid was dissolved in N-methyl-2-pyrrolidone (NMP) to give a 10% by mass solution, and the solution was stirred with 1% by mass of coumarin 6 relative to the mass of the polyamic acid. In this way, photosensitive resin composition of Example 1 was obtained.

[Chem. 14]

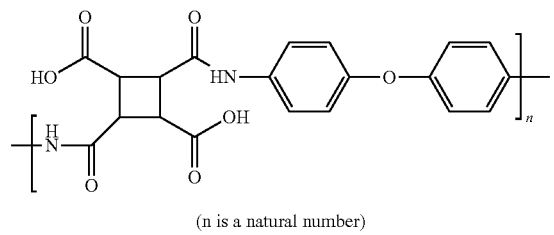

(11)

(n is a natural number)

A glass substrate was spin-coated with photosensitive resin composition 1 to form a coating that contained the polyamic acid and coumarin 6. The spin-coating conditions were 20 seconds at 3000 rpm.

The resulting coating was fired at 175° C. for 2 hours for imidization. In this way, a resin film was formed containing a cyclobutane diimide-bearing photosensitive resin (formula (12)) and coumarin 6.

[Chem. 15]

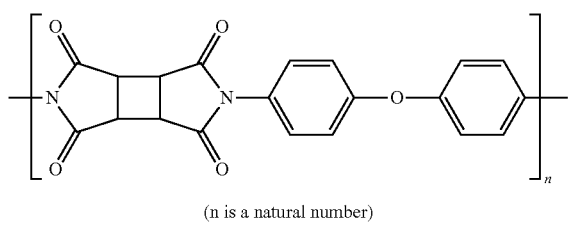

(12)

(n is a natural number)

The resulting coating was irradiated with ultraviolet radiation with a center wavelength of 254 nm using a photomask with line/space (L/S)=10 μm/50 μm (dose: 1000 mJ/cm$^2$). The exposed substrate was developed through immersion in dimethylacetamide, thereby patterning the resin film containing a cyclobutane diimide-bearing photosensitive resin and coumarin 6.

The developed substrate was subjected to cross-sectional SEM imaging. The resin film in the unexposed area remained, and that in the exposed area had been removed.

For the resin film in the unexposed area, the internal quantum yield of the coumarin 6 contained in the resin film was measured to be similar to those of coumarin 6 when dispersed in polystyrene or polyvinyl acetal. No discoloration was observed in the resin film.

The internal quantum yields were measured using Otsuka Electronics QE-1000. Specifically, the phosphor material was excited with light of its maximum absorption wavelength, and the internal quantum yield was calculated from the absorbed and emitted photon counts of the phosphor material using the following equation.

[Internal quantum yield]=[The number of photons emitted from the phosphor]/[The number of photons absorbed by the phosphor]

Example 2

A photosensitive resin that had a nitrobenzyl amide photosensitive moiety (formula (13)) was synthesized according to NPL 2 (J. Mater. Chem. 4 (1994) 1769).

[Chem. 16]

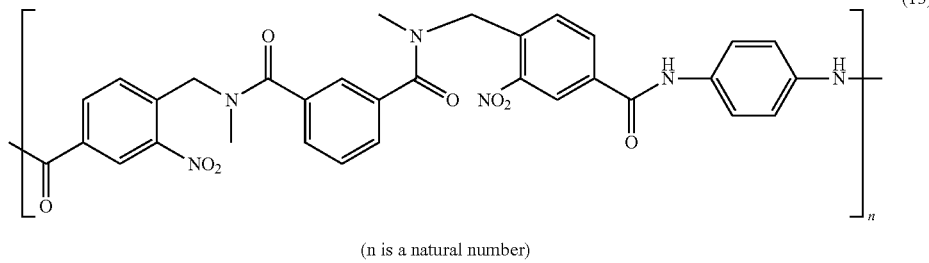

(13)

(n is a natural number)

The resulting photosensitive resin was dissolved in NMP to give a 10% by mass solution, and the solution was stirred with 1% by mass of Lumogen Red relative to the mass of the photosensitive resin. In this way, photosensitive resin composition 2 of Example 2 was obtained.

A resin film containing the nitrobenzyl amide-bearing photosensitive resin and Lumogen Red was patterned in the same way as in Example 1, except that the exposure radiation was an 800 mJ/cm$^2$ dose of ultraviolet radiation with a center wavelength of 356 nm and that the developer was isopropyl alcohol.

The developed substrate was subjected to cross-sectional SEM imaging. The resin film in the unexposed area remained, and that in the exposed area had been removed.

For the resin film in the unexposed area, the internal quantum yield of the Lumogen Red contained in the resin film was measured to be similar to those of Lumogen Red when dispersed in polystyrene or polyvinyl acetal. No discoloration was observed in the resin film.

Example 3

A photosensitive resin that had a nitrobenzyl ether photosensitive moiety (formula (14)) was synthesized according to NPL 3 (Journal of Polymer Science: Part A: Polymer Chemistry 45, (2007) 776).

[Chem. 17]

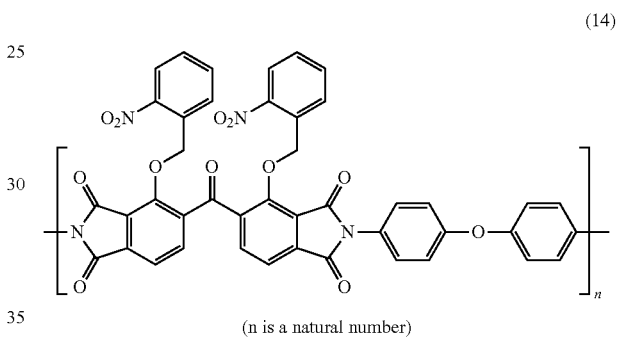

(14)

(n is a natural number)

The resulting photosensitive resin was dissolved in NMP to give a 10% by mass solution, and the solution was stirred with 1% by mass of fluorescein relative to the mass of the photosensitive resin. In this way, photosensitive resin composition 3 of Example 3 was obtained.

A resin film containing the nitrobenzyl ether-bearing photosensitive resin and fluorescein was patterned in the same way as in Example 1, except that the exposure radiation was a 6000 mJ/cm$^2$ dose of ultraviolet radiation with a center wavelength of 356 nm and that the developer was 2.38% tetramethylammonium hydroxide (TMAH).

The developed substrate was subjected to cross-sectional SEM imaging. The resin film in the unexposed area remained, and that in the exposed area had been removed.

For the resin film in the unexposed area, the internal quantum yield of the fluorescein contained in the resin film was measured to be similar to those of fluorescein when dispersed in polystyrene or polyvinyl acetal. No discoloration was observed in the resin film.

Example 4

A high-resolution wavelength-conversion organic EL display was produced in accordance with Embodiment 3. The following describes the specific operations.
(Forming a Black Matrix)
A 0.5-mm thick glass substrate measuring 21.0 cm×16.0 cm was washed with water and then sonicated in acetone for 10 minutes, in a 0.1 mol/L aqueous solution of sodium hydroxide for 10 minutes, and then in ultrapure water for 10 minutes. The substrate was then dried at 100° C. for 1 hour.

After 1 minute of ultraviolet-ozone cleaning, a BK resist (Tokyo Ohka) as a black matrix-forming composition was applied to the substrate by spin coating and prebaked at 90° C. for 1 minute to form a coating with a thickness of 1 μm. With a photomask having a pattern of 7.2-μm wide lines and 10 μm×44.6 μm openings (subpixel size, 17.2 μm×51.8 μm; pixel density, 490 ppi; aperture ratio, 50%) positioned on the coating to cover a 19.7 cm×14.8 cm region (a 4:3 aspect ratio, 9.7 inches) around the center of the substrate, the coating was exposed through irradiation with a 100 mJ/cm$^2$ exposure dose of i-radiation. The substrate was then developed using a 2.38% aqueous solution of TMAH as developer and rinsed with purified water. In this way, a 1-μm thick black matrix was formed in a pixel pattern with a line width of 7.2 μm.
(Forming Partitions)
A polyimide-based positive resist material (Toray) was then applied to the substrate by spin coating and prebaked at 120° C. for 3 minutes to form a coating with a thickness of 7 μm. With a photomask positive-negative reversed from that used in the formation of the black matrix positioned on the coating in the same way, to cover the 19.7 cm×14.8 cm region (a 4:3 aspect ratio, 9.7 inches) around the center of the substrate, and aligned so that the top of the black matrix would be exposed, the coating was exposed through irradiation with a 300 mJ/cm$^2$ exposure dose of i-radiation.

The substrate was then developed using a 1.5% aqueous solution of TMAH as developer and rinsed with purified water. The rinsed substrate was heated in an oven under nitrogen at 200° C. for 60 minutes for postbaking. In this way, 6-μm thick partitions were formed on the black matrix with a line width of 7.0 μm.
(Forming a Reflection Layer)
An aluminum reflection layer was formed by vacuum deposition to 200 nm covering the entire surface of the side of the substrate on which the partitions were formed. To remove aluminum from the open areas, or the areas clear of the black matrix, a positive resist for aluminum patterning (Tokyo Ohka) was applied to the aluminum-coated side of the substrate by spin coating and prebaked at 110° C. for 1 minute to form a coating with a thickness of 1.2 μm. With the photomask used in the formation of the partitions on this coating and aligned so that the open areas, or the areas clear of the black matrix, would be exposed, the coating was exposed through irradiation with a 68.5 mJ/cm$^2$ exposure dose of i-radiation.

The substrate was then developed using a 2.38% aqueous solution of TMAH as developer and rinsed with purified water. The rinsed substrate was heated on a hot plate at 120° C. for 3 minutes for postbaking. In this way, the positive resist for aluminum patterning was made into a 1-μm thick pattern covering aluminum on the partitions. To remove aluminum from the open areas, or the areas clear of the black matrix, by etching, the substrate was immersed in the SLA etchant as etching solution for 3 minutes. Then, to remove the positive resist for aluminum patterning from the partitions, the substrate was immersed in acetone.
(Forming Color Filters)
Then, to make each row of three open areas, areas clear of the black matrix, into an RGB pixel, red, green, and blue color filters were formed through patterning by an existing photolithographic process, with one color filter in one of the three open areas. The formed color filters were all 2 μm thick.
(Forming a Light-Scattering Layer)
A light-scattering layer was then formed on the blue color filters as follows. A titanium oxide with an average particle diameter of 200 nm as light-scattering particles was thoroughly ground with an epoxy resin (Nippon Kayaku "SU-8") in an automatic mortar grinder, and the resulting mixture was stirred using a disperser/mixer (Primix "FILMIX® 40-40") for 15 minutes. In this way, a light-scattering-layer-forming composition was prepared.

The light-scattering-layer-forming composition was then applied to the substrate, and a coating was formed by spin coating.

The resulting coating was cured through irradiation with parallel rays of i-radiation at 600 mJ/cm$^2$ in a nitrogen atmosphere using a photomask patterned so that the top of only the blue color filters would be exposed to the rays. The glass substrate with this cured coating was then developed by dissolving the coating in the unexposed area in PGMEA, forming a pattern. The glass substrate with this pattern formed thereon was heated on a hot plate at 90° C. to remove the residual solvent. In this way, a light-scattering layer (a blue-light-scattering layer) was formed. The resulting light-scattering layer was 4 μm thick.
(Forming Wavelength Conversion Units)
To-green and to-red wavelength conversion units were then formed on the green and red color filters, respectively, as follows.

First, the to-green wavelength conversion units were formed using the process of Example 1, except that the photomask in Example 1 was changed to one with which only the green color filters would be covered with the formed pattern. Then the to-red wavelength conversion units were formed using the process of Example 2, except that the photomask in Example 2 was changed to one with which only the red color filters would be covered with the formed pattern and that the light emitting material was changed to Lumogen Red with additional 0.3% by mass of coumarin 6 relative to the mass of the photosensitive resin.

The resulting substrate was observed under an optical microscope for two-dimensional images, revealing that the to-green and to-red wavelength conversion units measured 10 μm×44.6 μm, the subpixel size was 17.2 μm×51.8 μm, and the aperture ratio was 50%. The internal quantum yield of wavelength conversion units assessed by passing blue light with a peak wavelength of 450 nm (full width at half maximum, 40 nm) through the resulting substrate was 90%.

In this way, a wavelength conversion substrate was obtained.
(Producing an Organic EL Element Substrate)
A blue-phosphorescent organic EL element substrate was produced as a light emitting unit in the way illustrated in FIG. 4. The following describes the specific operations.

(Forming Thin-Film Transistors, an Interlayer Insulating Layer, and Anodes)

Thin-film transistors having an IGZO semiconductor layer were formed on a substrate of the same material and size as the wavelength conversion substrate through an existing semiconductor process, and a silicon nitride interlayer insulating layer was formed on the thin-film transistors. In the regions above the source electrodes of the thin-film transistors, the interlayer insulating layer was partially removed to create contact holes. A silver film to provide electrodes for the reflection of organic EL was then formed on the interlayer insulating layer by vacuum deposition to a thickness of 100 nm, and an ITO film to provide transparent electrodes was formed on the entire surface of the silver film by sputtering to a thickness of 20 nm. These films were then patterned by photolithography into 10 μm×44.6 μm rectangular anodes (pixel electrodes) with a distance between anodes of 7.2 μm and a pixel density of 490 ppi. The anodes were electrically coupled to the source electrodes of the transistors via the contact holes.

(Forming an Organic EL Layer)

With the substrate on which the anodes and all lower-layer elements had been formed fastened to the substrate holder in an in-line resistance-heating evaporating system and the pressure reduced to $1 \times 10^{-4}$ Pa or less, hole injection, hole transport, blue light emitting, hole-blocking, electron transport, and electron injection layers were formed in this order in accordance with the material and thickness specifications in Table 3 to give an organic EL layer.

TABLE 3

| | Material(s) | Thickness (nm) |
|---|---|---|
| Hole injection layer | 1,1-Bis-di-4-tolylamino-phenyl-cyclohexane | 100 |
| Hole transport layer | N,N'-di-1-naphthyl-N,N'-diphenyl-1,1'-biphenyl-4,4'-diamine | 40 |
| Blue light emitting layer | 1,4-Bis-triphenylsilyl-benzene . . . (host material) Bis[(4,6-difluorophenyl)-pyridinato-N,C2']picolinate iridium(III) . . . (blue phosphorescence emitting dopant) | 30 |
| Hole-blocking layer | 2,9-Dimethyl-4,7-diphenyl-1,10-phenanthroline | 10 |
| Electron transport layer | Tris(8-hydroxyquinoline)aluminum | 30 |
| Electron injection layer | Lithium fluoride | 0.5 |

(Forming a Cathode)

Magnesium and silver were co-deposited on the surface of the organic EL layer by vacuum deposition using a shadow mask to form a 1-nm thick magnesium-silver layer. This layer was covered with a 19-nm thick silver layer to form a cathode (semitransparent electrode).

In this way, an organic EL substrate was obtained as a light emitting unit.

(Bonding Together)

A light-curable sealant (Sekisui Chemical) was applied to the periphery of the wavelength conversion substrate using a dispenser, and the wavelength conversion substrate was joined to the organic EL substrate in a nitrogen atmosphere with some adjustment to make the pixels in the wavelength conversion substrate aligned with those in the organic EL substrate. The two substrates were then bonded together by curing the sealant through exposure to ultraviolet radiation with the pixels shielded from the radiation. A driving circuit for the control of the thin-film transistors and the organic EL substrate were then electrically coupled. In this way, a wavelength-conversion blue-phosphorescent organic EL display was produced.

(Turning on and Estimating the Power Consumption)

When the organic EL substrate of this Example was driven at a current density of 10 mA/cm$^2$ to emit blue light, the light on the display looked white through the wavelength conversion substrate.

The power consumption of the display of this Example assessed by allowing the display to emit white light at 160 cd/cm$^2$ was 10.3 W.

Example 5

The concentration of Lumogen Red relative to resin in the to-red wavelength conversion units and that of coumarin 6 in the to-green wavelength conversion units in Example 4 were changed to 10% by mass, 7% by mass, 5% by mass, 3% by mass, 2% by mass, and 1.5% by mass to give wavelength conversion substrates with internal quantum yields of wavelength conversion units of 52%, 63%, 70%, 76%, 80%, and 85%, respectively. Displays were produced by joining these substrates to an organic EL substrate identical to that in Example 4 and assessed for power consumption in the same way as in Example 4.

Comparative Example 1

As a typical example of a known display, an active-matrix IPS liquid-crystal display of the same substrate size and pixel density (490 ppi) as in Example 4 was obtained. Its estimated power consumption assessed in the same way as in Example 4 was 15.1 W, demonstrating that dramatic reductions in power consumption can be achieved with displays according to an aspect of the present invention.

Figure 14:
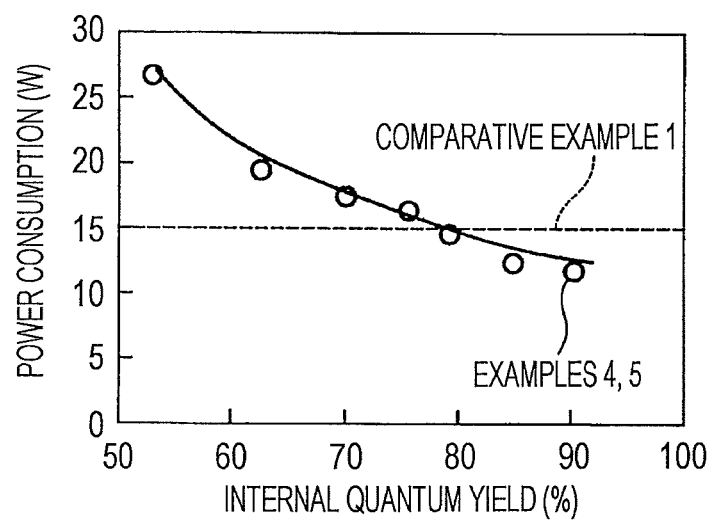
FIG. 14 is a graph that plots power consumption versus internal quantum yield for the displays of Examples 4 and 5 and Comparative Example 1.

FIG. 14 is a graph that plots power consumption versus internal quantum yield for the displays of Examples 4 and 5 and Comparative Example 1. In the graph illustrated in FIG. 14, the horizontal axis is for internal quantum yield (unit: %), and the vertical for power consumption (unit: W).

As can be seen from FIG. 14, it was found that displays of the Examples consume less power than, and therefore are superior to, a known IPS liquid-crystal display when the internal quantum yield is 80% or more.

Example 6

Wavelength conversion substrates and organic EL substrates produced in the same way except that the pixel density in Example 4 was changed to 300 ppi, 350 ppi, 400 ppi, 450 ppi, 600 ppi, and 700 ppi for each were prepared and joined together into displays. The vertical×horizontal scales of the individual wavelength conversion sites in two-dimensional images observed under an optical microscope were 72.8×16.4, 62.4×14.1, 54.6×12.3, 48.2×10.9, 36.4×8.2, and 31.2×7.0. The resulting displays were assessed for power consumption in the same way as in Example 4.

Comparative Example 2

Liquid-crystal displays were prepared. These displays were identical to that of Comparative Example 1 except that the pixel density was different: 300 ppi, 350 ppi, 400 ppi, 450 ppi, and 550 ppi. The displays were assessed for power consumption.

Figure 15:
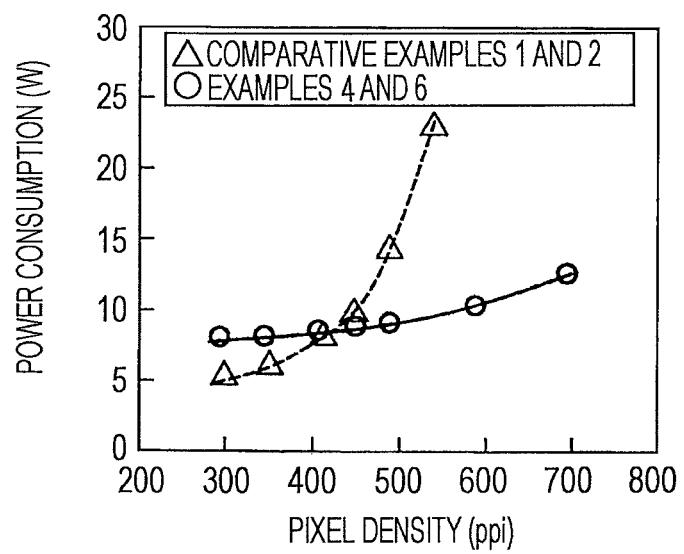
FIG. 15 is a graph that plots power consumption versus pixel density for the displays of Examples 4 and 6 and Comparative Examples 1 and 2.

FIG. 15 is a graph that plots power consumption versus pixel density for the displays of Examples 4 and 6 and Comparative Examples 1 and 2. In the graph illustrated in FIG. 15, the horizontal axis is for display pixel density (unit: ppi), and the vertical for power consumption (unit: W).

As can be seen from FIG. 15, liquid-crystal displays rapidly increase in power consumption with improving pixel density. When the pixel density improves, the proportion of the optically non-transparent region, created by a thin-film transistor and wiring, per subpixel increases, and the aperture ratio decreases. These presumably raise the minimum brightness required for the backlights of the liquid-crystal display to be lit.

Displays according to an aspect of the present invention experience an increase in power consumption with increasing pixel density, but not to a great extent. These displays therefore consume less power than known liquid-crystal displays at pixel densities of 450 ppi or more.

From these results, it was found that the aspect of the present invention is useful.

REFERENCE SIGNS LIST

1 . . . Phosphor substrate (wavelength conversion substrate); 5, 6, 63 . . . Wavelength conversion substrate; 10 . . . Light emitting device; 11, 21 . . . Substrate; 14b, 15b . . . Phosphor layer (wavelength conversion unit); 642 . . . Wavelength conversion unit; L1 . . . Excitation light

The invention claimed is:

1. A photosensitive resin composition comprising:
a positive photosensitive resin having a photosensitive moiety that cleaves upon exposure to light; and
a wavelength conversion material dispersed in the photosensitive resin, wherein
the photosensitive resin and the wavelength conversion material meet the following (i) to (iv):
  (i) the photosensitive moiety and a cleavage product of the photosensitive resin do not neutralize the wavelength conversion material;
  (ii) the photosensitive moiety and the cleavage product do not induce hydrolysis of the wavelength conversion material;
  (iii) HOMOs of the photosensitive moiety and the cleavage product are lower than a LUMO of the wavelength conversion material; and
  (iv) LUMOs of the photosensitive moiety and the cleavage product are higher than a HOMO of the wavelength conversion material, excluding any combination of a chemically amplified photosensitive resin with an acidic photosensitive moiety or cleavage product and an acidic wavelength conversion material,
the photosensitive moiety and the cleavage product of the photosensitive resin are neutral, and
the photosensitive moiety of the photosensitive resin includes at least one selected from the group consisting of cyclobutane diimide, o-nitrobenzyl amide, o-nitrobenzyl ether, methyl phenyl carbonate, 1-benzyloxy-1-alkyl ethanol, and disilane structures.

2. The photosensitive resin composition according to claim 1, wherein the photosensitive moiety of the photosensitive resin is a cyclobutane diimide structure.

3. The photosensitive resin composition according to claim 1, wherein the wavelength conversion material has a proton-accepting or proton-donating group.

4. The photosensitive resin composition according to claim 1, wherein the wavelength conversion material has a dehydration-condensable group.

5. The photosensitive resin composition according to claim 1, wherein the wavelength conversion material has a coumarin or boron-dipyrromethene structure.

6. The photosensitive resin composition according to claim 1, wherein the photosensitive resin has transparency for light of a visible spectrum.

7. The photosensitive resin composition according to claim 1, further comprising a solvent that dissolves the photosensitive resin.

8. A wavelength conversion substrate comprising:
a substrate; and
a wavelength conversion unit provided on the substrate, wherein
the wavelength conversion unit is formed from a photosensitive resin composition according to claim 1.

9. A light emitting device comprising:
a light source that emits excitation light; and
a wavelength conversion unit that absorbs the excitation light and emits light of a wavelength different from a wavelength of the excitation light, wherein
the wavelength conversion unit is formed from a photosensitive resin composition according to claim 1.

10. The light emitting device according to claim 9, wherein the light emitting device includes a wavelength conversion substrate including:
a substrate; and
the wavelength conversion unit provided on the substrate.

11. The light emitting device according to claim 10, wherein the wavelength conversion substrate includes a structural body that abuts the wavelength conversion unit on at least one side thereof and reflects or diffuses the light emitted from the wavelength conversion unit.

12. The light emitting device according to claim 11, wherein the structural body is formed from a material including a metallic material.

13. The light emitting device according to claim 9, wherein the wavelength conversion unit exhibits an internal quantum yield for light emission of 80% or more.

14. The light emitting device according to claim 9, wherein the wavelength conversion substrate includes multiple wavelength conversion units arranged in a matrix, and
the multiple wavelength conversion units have a density of 450 ppi or more.

* * * * *